United States Patent
Hosoya

(10) Patent No.: US 10,937,626 B2
(45) Date of Patent: Mar. 2, 2021

(54) HOLDER AND CHARGED PARTICLE BEAM APPARATUS

(71) Applicant: HITACHI HIGH-TECH CORPORATION, Tokyo (JP)

(72) Inventor: Kotaro Hosoya, Agoura Hills, CA (US)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/992,430

(22) Filed: Aug. 13, 2020

(65) Prior Publication Data
US 2020/0373119 A1 Nov. 26, 2020

Related U.S. Application Data

(63) Continuation of application No. 16/357,796, filed on Mar. 19, 2019, now Pat. No. 10,777,379.

(51) Int. Cl.
*H01J 37/20* (2006.01)
*H01J 37/244* (2006.01)
*H01J 37/22* (2006.01)
*H01J 37/26* (2006.01)

(52) U.S. Cl.
CPC ............ *H01J 37/20* (2013.01); *H01J 37/224* (2013.01); *H01J 37/226* (2013.01); *H01J 37/244* (2013.01); *H01J 37/222* (2013.01); *H01J 37/26* (2013.01); *H01J 2237/20214* (2013.01); *H01J 2237/2443* (2013.01); *H01J 2237/2445* (2013.01)

(58) Field of Classification Search
CPC ........ H01J 37/20; H01J 37/226; H01J 37/244; H01J 37/224; H01J 2237/2443; H01J 2237/20214; H01J 2237/2445; H01J 37/26; H01J 37/222

USPC ................................. 250/306, 307, 310, 311
See application file for complete search history.

(56) References Cited

U.S. PATENT DOCUMENTS

| | | | | |
|---|---|---|---|---|
| 9,812,288 | B2* | 11/2017 | Shouji | H01J 37/26 |
| 2004/0046120 | A1* | 3/2004 | Moses | H01J 37/28 250/311 |
| 2011/0291010 | A1* | 12/2011 | Katane | H01J 37/244 250/310 |
| 2014/0014835 | A1* | 1/2014 | Hosoya | H01J 37/28 250/307 |
| 2016/0025659 | A1* | 1/2016 | Ominami | G01N 23/2251 250/307 |

(Continued)

FOREIGN PATENT DOCUMENTS

| JP | 2008066057 A | * | 3/2008 |
| JP | 2008066057 A | | 3/2008 |
| JP | 2013225530 A | | 10/2013 |

*Primary Examiner* — Michael Maskell
(74) *Attorney, Agent, or Firm* — Mattingly & Malur, PC

(57) ABSTRACT

According to one embodiment, a holder includes a top member, a side member, and a bottom member. The top member has a hole for allowing transmission of a charged particle beam, and the sample is mountable in the hole. The bottom member is provided to overlap with the top member in a plan view. The side member is connected to a part of the top member and a part of the bottom member such that the top member and the bottom member are separated from each other in a cross-sectional view. An opening portion is a region surrounded by the top member, the side member, and the bottom member, and a scintillator is provided in the opening portion.

5 Claims, 17 Drawing Sheets

(56) References Cited

U.S. PATENT DOCUMENTS

2016/0329188 A1* 11/2016 Ominami ............... H01J 37/18

* cited by examiner

HOLDER AND CHARGED PARTICLE BEAM APPARATUS

BACKGROUND OF THE INVENTION

1. Field of the Invention

The present invention relates to a holder and a charged particle beam apparatus and particularly can be suitably used for detecting light using a holder.

2. Description of Related Art

In order to scan a sample with an electron beam to obtain a desired transmission electron image from the sample, for example, a charged particle beam apparatus such as a scanning transmission electron microscope (STEM) or a scanning electron microscope (SEM) is used. In the scanning electron microscope, even at a relatively low acceleration voltage of several tens of kV, a transmission electron image with an extremely high contrast and a high resolution can be obtained.

For example, FIG. 21 illustrates a charged particle beam apparatus of the prior art. As illustrated in FIG. 21, a sample SAM is mounted on a mesh MS provided in a holder HL in a charged particle beam apparatus, and a reflecting plate RF is provided in a region of the holder HL below the sample SAM. Here, a transmitted electron EB4 having transmitted downward through the sample SAM when the sample SAM is irradiated with a charged particle beam EB1 is reflected from the reflecting plate RF that is obliquely inclined. Reflected secondary electrons EB5 are detected by a detector ETD called an Everhart Thornley detector.

In addition, JP-A-2008-66057 discloses a technique in which a transmitted electron having transmitted downward through a sample when the sample is irradiated with an electron beam is caused to collide with an obliquely inclined scintillator such that light emitted from the scintillator is caused to transmit through a through hole in a horizontal direction and is incident into a photomultiplier tube provided in an exit of the through hole.

In addition, JP-A-2013-225530 discloses a technique in which exciting light having image information is detected by causing a luminescent phenomenon to occur using gas scintillation in a chamber that is controlled to be in a low vacuum of about 1 Pa to 3000 Pa, and also discloses a detector that can detect the exciting light.

SUMMARY OF THE INVENTION

In the prior art illustrated in FIG. 21, electrons detected by the detector ETD include not only the secondary electrons EB5 reflected from the reflecting plate RF but also secondary electrons EB6 emitted from a surface of the sample SAM. Accordingly, it is difficult to generate an accurate transmission electron image based on the secondary electrons EB5 detected by the detector ETD. In particular, in the technique illustrated in FIG. 21, when the sample SAM is thick, the amount of the secondary electrons EB6 increases such that the contrast of the transmission electron image may vary largely. From this point of view, it is also difficult to generate an accurate transmission electron image with the technique of FIG. 21.

In addition, redundant transmitted electrons are caused to collide with the reflecting plate RF. Therefore, a scattering angle diaphragm ASA3 that limits a scattering angle needs to be provided immediately below the sample SAM. Thus, it is difficult to acquire a transmission electron image having only a small scattering angle (for example, 75 mrad or less). On the other hand, a configuration of reducing the size of the scattering angle diaphragm ASA3 can also be considered. However, the size of a region that can be observed on the sample SAM is substantially the same as an aperture of a hole of the scattering angle diaphragm ASA3, and thus a range that can be observed is extremely small.

In addition, in general, the detector ETD includes a scintillator and a photomultiplier tube. The secondary electrons EB5 converted from the transmitted electrons EB4 are converted into light by the detector ETD, the light is amplified by the photomultiplier tube, and the amplified light is converted into an electric signal. At this time, the signal conversion process is performed in order of the transmitted electrons EB4, the secondary electrons EB5, the light, and the electric signal. Therefore, the loss during the signal conversion increases, and there is a problem in that the yield decreases.

In JP-A-2008-66057, in order to detect transmitted electrons, it is necessary to newly attach a high-accuracy detector to a side of the holder. This implies that it is necessary to reconstruct a structure and a system of a new charged particle beam apparatus, which requires high costs.

The present invention is to provide a charged particle beam apparatus having improved performance that can accurately obtain a bright-field image or a dark-field image of a sample as an observation target. In addition, another object of the present invention is to provide a holder used in the charged particle beam apparatus.

Other objects and new characteristics will be clarified with reference to description of the specification and the accompanying drawings.

The summary of a representative embodiment disclosed in the present application will be simply described as follows.

According to one embodiment, a holder includes: a top member that has a first hole for allowing transmission of a charged particle beam and in which a sample is mountable in the first hole; a bottom member that is provided to overlap with the top member in a plan view; a side member that is connected to a part of the top member and a part of the bottom member such that the top member and the bottom member are separated from each other in a cross-sectional view. In addition, the holder includes: an opening portion that is a region surrounded by the top member, the side member, and the bottom member; and a first scintillator that is provided in the opening portion.

In addition, according to another embodiment, a charged particle beam apparatus includes: a chamber; a charged particle optical lens barrel that is attached to an upper portion of the chamber and is capable of emitting a charged particle beam; a stage that is attached to a lower portion of the chamber; a holder that is provided on the stage; and a first light detector that is positioned above the holder to be separated from the holder and is attached to the upper portion of the chamber. Here, the holder: a top member that has a first hole for allowing transmission of a charged particle beam and in which a sample is mountable in the first hole; a bottom member that is provided to overlap with the top member in a plan view; a side member that is connected to a part of the top member and a part of the bottom member such that the top member and the bottom member are separated from each other in a cross-sectional view. In addition, the holder includes: an opening portion that is a region surrounded by the top member, the side member, and the bottom member; and a first scintillator that is provided in the opening portion. In addition, the first light detector has a function capable of detecting first light that is emitted from the first scintillator and exits from the opening portion when the sample is mounted on the top member, the sample in the first hole is irradiated with the charged particle beam emitted from the charged particle optical lens barrel, and transmitted charged particles transmitted through the sample collide with the first scintillator.

According to the embodiments disclosed in the present invention, the holder that can accurately obtain a bright-field image or a dark-field image of the sample SAM as an observation target can be provided. In addition, by using the holder, the performance of the charged particle beam apparatus can be improved.

DESCRIPTION OF EMBODIMENTS

Figure 1:
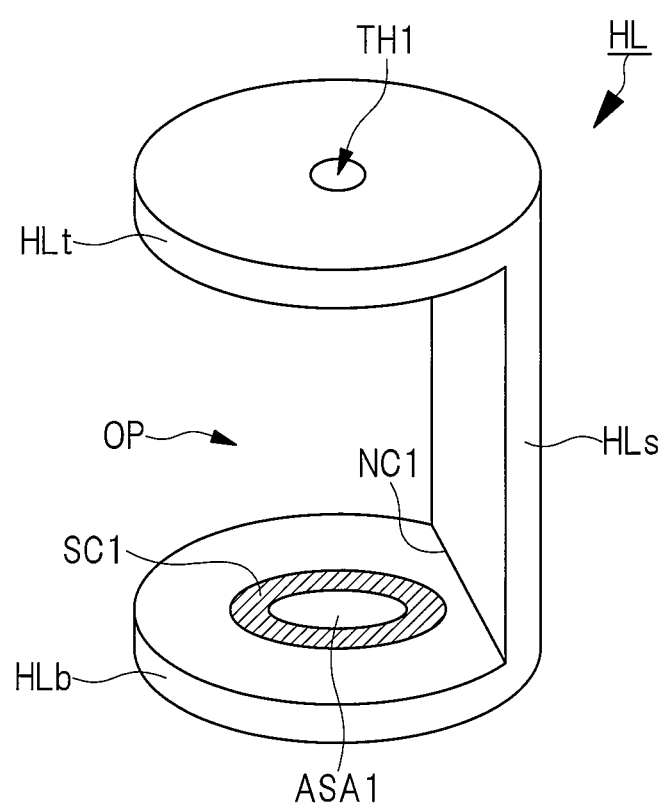
FIG. 1 is a perspective view illustrating a holder according to a first embodiment.

Hereinafter, an embodiment of the present invention will be described in detail based on the drawings. In all the diagrams for describing the embodiment, members having the same functions are represented by the same reference numerals, and the description thereof will not be repeated. In the following embodiment, basically, the description of the same or identical portions will not be repeated.

First Embodiment

Figure 2:
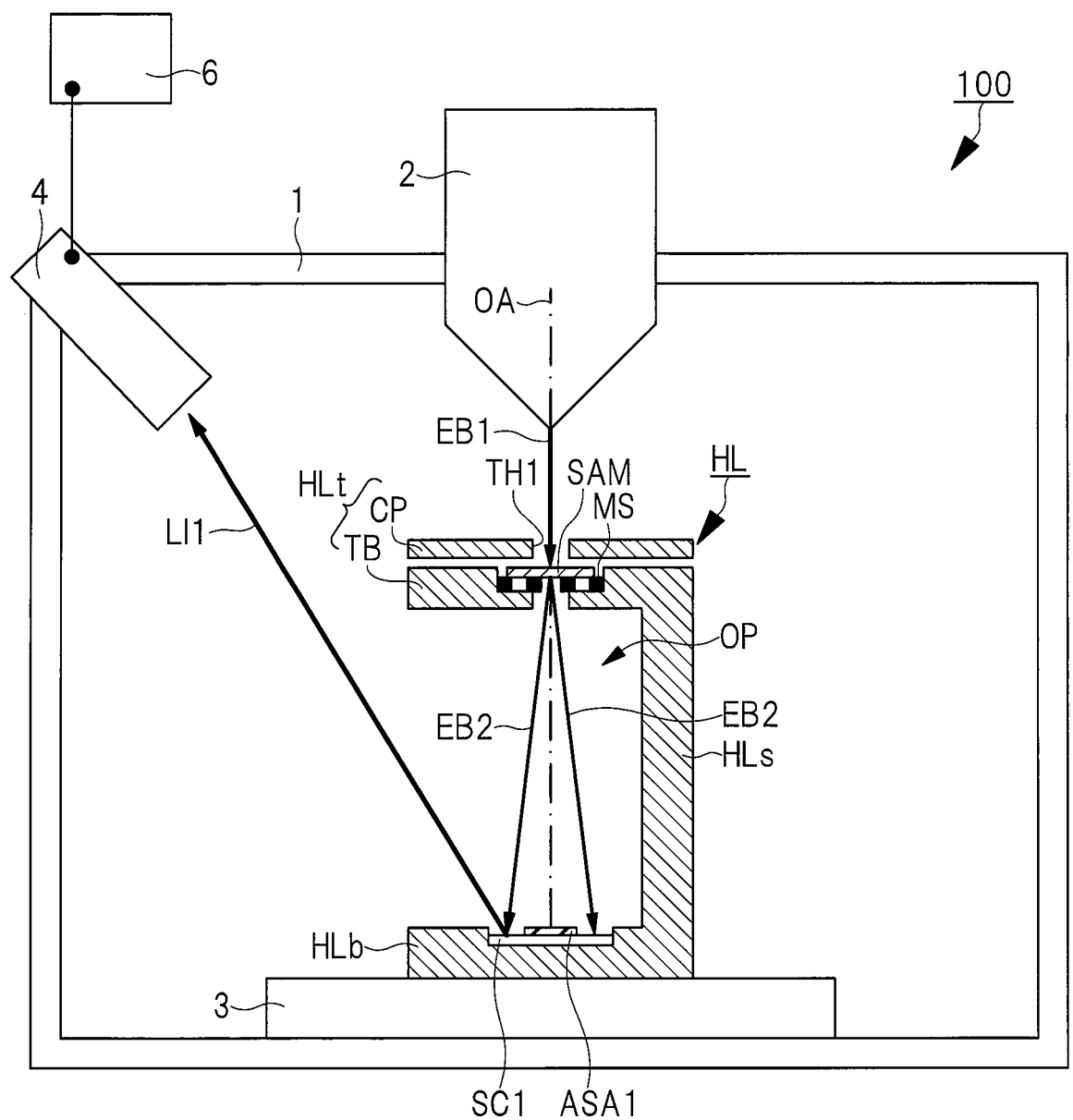
FIG. 2 is a cross-sectional view illustrating a charged particle beam apparatus according to the first embodiment.

Hereinafter, a holder HL according to a first embodiment and a charged particle beam apparatus 100 including the holder HL will be described using FIGS. 1 and 2. The charged particle beam apparatus 100 is, for example, a scanning electron microscope (SEM). FIG. 1 is a perspective view illustrating the external appearance of the holder HL. FIG. 2 is a cross-sectional view illustrating the charged particle beam apparatus 100 and also illustrating the detailed cross-sectional structure of the holder HL.

As illustrated in FIG. 1, the holder HL according to the first embodiment includes a top member HLt, a side member HLs, and a bottom member HLb. The bottom member HLb is provided to overlap with the top member HLt in a plan view, and the side member HLs is connected to a part of the top member HLt and a part of the bottom member HLb such that the top member HLt and the bottom member HLb are separated from each other in a cross-sectional view. In the vicinity of the top member HLt, a hole TH1 for allowing transmission of a charged particle beam EB1 illustrated in FIG. 2 is provided to penetrate the top member HLt.

An opening portion OP is a region surrounded by the top member HLt, the side member HLs, and the bottom member HLb. In the opening portion OP, a scattering angle diaphragm ASA1 and a scintillator SC1 are provided. The scattering angle diaphragm ASA1 partially covers a surface of the scintillator SC1 such that only transmitted charged particles having a specific scattering angle collide with the scintillator SC1. In the first embodiment, a case where the scattering angle diaphragm ASA1 and the scintillator SC1 are provided on the bottom member HLb is described as an example.

A planar shape of the holder HL is a circular shape or an elliptical shape. In a portion where the side member HLs is connected to the top member HLt and the bottom member HLb, a notch NC1 is provided on an inner wall of each of the top member HLt and the bottom member HLb. Therefore, in the opening portion OP, a planar shape of the inner wall of each of the top member HLt and the bottom member HLb is a shape that is obtained by providing the notch NC1 in a part of the circular shape or the elliptical shape.

In addition, a material forming each of the members (the top member HLt, the side member HLs, and the bottom member HLb) forming the holder HL is a metal such as aluminum or an alloy such as stainless steel. In addition, the material forming the holder HL has a function of not allowing light and an X-ray. In addition, the light is light from a vacuum-ultraviolet range to a visible range. In the first embodiment, a case where the top member HLt, the side member HLs, and the bottom member HLb are integrated with each other is described as an example. However, these members may be formed as different members.

As illustrated in FIG. 2, in the top member HLt, a sample SAM is mounted in the hole TH1. The top member HLt includes a table TB and a cap CP that is provided on the table TB. The table TB is provided to mount a mesh MS on which the sample SAM is provided, and the cap CP is provided to hold the sample SAM and the mesh MS.

The charged particle beam apparatus 100 includes: a chamber 1; a charged particle optical lens barrel 2 that is attached to an upper portion of the chamber 1; a stage 3 that is attached to a lower portion of the chamber 1; the holder HL that is provided on the stage 3; and a light detector 4 that is positioned above the holder HL to be separated from the holder HL and is attached to the upper portion of the chamber 1.

The charged particle optical lens barrel 2 includes: an electron gun for emitting a charged particle beam (electron beam); a condenser lens; and a scan coil for controlling scanning in a horizontal direction. The charged particle beam (electron beam) EB1 is emitted from the charged particle optical lens barrel 2 and is irradiated toward the sample SAM.

The stage 3 is a base for mounting the holder HL and includes a mechanism of adjusting a position in a thickness and a horizontal direction and a mechanism for rotation in a horizontal direction. By rotating the stage 3, a direction of the holder HL mounted on the stage 3 can be changed. In addition, a material forming the stage 3 is the same as the material forming each of the members of the holder HL. In addition, in the first embodiment, the holder HL is freely detachable from the stage 3.

The light detector 4 has a function capable of detecting light LI1 that is emitted from the scintillator SC1 and exits from the opening portion OP of the holder HL. This function will be described below in detail.

An image processing apparatus 6 is connected to the light detector 4 and has a function of converting transmitted charged particle information included in the light LI1 into a transmitted charged particle image. The image processing apparatus 6 includes, for example, a photomultiplier tube, an amplifier circuit, and an A/D converter and converts an optical signal into an electric signal using these components. That is, the light LI1 is converted into image data regarding a transmitted charged particle image by the image processing apparatus 6. The image data is visibly recognized by a display device provided inside or outside the image processing apparatus 6. The image processing apparatus 6 may be attached to the inside of the charged particle beam apparatus 100 or may be attached to the outside of the charged particle beam apparatus 100.

Hereinafter, a method for observing the transmitted charged particle image of the sample SAM using the charged particle beam apparatus 100 in the first embodiment will be described. In the first embodiment, a case where a dark-field image of the sample SAM is observed will be described. The observation of the transmitted charged particle image of the sample SAM in the first embodiment is performed in a state where the internal pressure of the chamber 1 is set in a range of $1 \times 10^{-6}$ Pa to 3000 Pa and the inside of the chamber 1 is filled with air, nitrogen gas, or the like.

First, the holder HL where the sample SAM as an observation target is mounted on the mesh MS is prepared, and the holder HL is fixed to the stage 3. Next, the charged particle beam (electron beam) EB1 is emitted from the charged particle optical lens barrel 2. The charged particle beam EB1 passes through the hole TH1 of the holder HL along an optical axis OA and is irradiated on the sample SAM. The charged particle beam EB1 is scattered in the sample SAM and transmits downward through the sample SAM. Transmitted charged particles (transmitted electrons) EB2 having transmitted through the sample SAM reach the scattering angle diaphragm ASA1 in the opening portion OP of the holder HL. The scattering angle diaphragm ASA1 is set such that only transmitted charged particles EB2 having a specific scattering angle transmit through the scattering angle diaphragm ASA1. The transmitted charged particles EB2 having transmitted through the scattering angle diaphragm ASA1 collide with the scintillator SC1 in the opening portion OP of the holder HL.

When the transmitted charged particles EB2 collide with the scintillator SC1, kinetic energy of the transmitted charged particles EB2 is converted into light energy, and the light LI1 is emitted from the scintillator SC1. The light LI1 exits from the opening portion OP and is detected by the light detector 4. The light LI1 detected by the light detector 4 is input as an optical signal to the image processing apparatus 6 connected to the light detector 4. In the image processing apparatus 6, an optical signal is converted into an electric signal. As a result, image data is generated as a transmitted charged particle image, and the transmitted charged particle image (dark-field image) of the sample SAM can be observed by checking the image data using a display device or the like.

In addition, the light LI1 emitted from the scintillator SC1 in the first embodiment is light from a vacuum-ultraviolet range to a visible range and has the same transmitted charged particle information as that of the transmitted charged particles EB2. Therefore, as described above, the transmitted charged particle image can be checked by the image processing apparatus 6 based on the light LI1.

Hereinafter, characteristics of the light detector 4 and the light LI1 used in the first embodiment will be described.

The light detector 4 is called a ultra-variable pressure detector (UVD) and is the same detector as disclosed in JP-A-2013-225530 or a detector capable of detecting light. In particular, the UVD is used for observing a low vacuum, and the observation of a low vacuum is performed in a state where the internal pressure of the chamber 1 is set as, for example, 30 Pa and the inside of the chamber 1 is filled with air, nitrogen gas, or the like. the observation of a low vacuum is performed mainly in order to remove charge during observation of an insulated sample. The UVD is mounted on a large number of electron microscopes.

Hereinafter, the observation of a low vacuum using the light detector 4 disclosed in JP-A-2013-225530 will be described. In JP-A-2013-225530, in order to catch an amplified signal of secondary electron gas, a voltage of several hundreds of V is applied to a bias electrode arranged in the vicinity of the light detector 4. As a result, when an electric field is formed between the bias electrode and the sample SAM, secondary electrons generated from a surface of the sample SAM are accelerated, and the secondary electrons collide with residual gas molecules, and the residual gas molecules are ionized into positive ions and electrons. Exciting light generated at this time is detected by the light detector 4 such that a secondary electron image of a target in a low vacuum is formed.

The light detector 4 (UVD) in the first embodiment is originally set to detect fine exciting light and may be a high-sensitivity light detector. The light detector 4 can also detect exciting light as described above. However, a transmission electron image is formed using the light LI1 instead of using exciting light. In other words, the light detector 4 detects the light LI1 in an environment where exciting light is not detected. In order to enable the method to be performed, the voltage of the bias electrode arranged in the vicinity of the light detector 4 is set off (0 V). At this time, the environment in the chamber 1 may be either a low vacuum or a high vacuum. In the first embodiment, the light detector 4 detects only the light LI1 emitted from the scintillator SC1, and thus an accurate transmitted charged particle image can be obtained.

In this way, with the holder HL according to the first embodiment, the transmitted charged particles EB2 are converted into the light LI1, and the light LI1 can be converted into an electric signal by the photomultiplier tube connected to the light detector 4. That is, the signal conversion process is performed in order of the transmitted charged particles EB2, the light LI1, and the electric signal. Therefore, the loss during the signal conversion is small, the yield can be improved.

In addition, the contrast of the transmission electron image varies largely by changing the scattering angle. For example, when metal nanoparticles are observed, the contrast is inverted between a scattering angle of 0 mrad to 75 mrad and a scattering angle of 300 mrad to 600 mrad. Therefore, in order to acquire a clear transmission electron image, it is important to control the scattering angle. In particular, when the acceleration voltage of the charged particle beam EB1 is 30 kV, in a bright-field observation, a scattering angle of 75 mrad or less is necessary in many cases. When the scattering angle is controlled in a portion that is as distant from the sample SAM as possible, the accuracy of the control of the scattering angle is improved. Therefore, in the first embodiment, by providing the scattering angle diaphragm. ASA1 as a mask on the scintillator SC1, a range where the transmitted charged particles EB2 collide with the scintillator SC1 is limited. That is, by changing the shape of the scattering angle diaphragm ASA1 as a mask, the scattering angle that can be detected can be easily controlled.

In the first embodiment, the scintillator SC1 in the bottom member HLb is partially covered with the scattering angle diaphragm ASA1, and the scattering angle diaphragm ASA1 can be changed to a scattering angle diaphragm corresponding to a desired scattering angle including a dark field.

In this way, with the charged particle beam apparatus 100 according to the first embodiment, a bright-field image or a dark-field image of the sample as an observation target can be accurately obtained. In addition, the reason why the above-described effect is obtained is that the holder HL is provided including: the top member HLt on which the sample SAM is mountable; and the scintillator SC1 that is provided in the opening portion OP. In other words, according to the first embodiment, the holder HL that can accurately obtain a bright-field image or a dark-field image of the sample SAM as an observation target can be provided. In addition, by using the holder HL, the performance of the charged particle beam apparatus 100 can be improved.

In addition, as described above, in the first embodiment, using the light detector 4 that is attached to the upper portion of the chamber 1, the light LI1 that is emitted from the scintillator SC1 and exits from the opening portion OP of the holder HL can be detected. Accordingly, it is not necessary to connect a cable or the like to the holder HL. That is, in order to detect the light LI1, it is required to newly introduce a dedicated light detector, to develop a structure of a new charged particle beam apparatus, and to reconstruct a detection system. Therefore, costs for the requirements can be reduced.

Modification Example 1

Hereinafter, the holder HL according to Modification Example 1 of the first embodiment and the charged particle beam apparatus 100 including the holder HL will be described using FIG. 3.

In the first embodiment, the case where the dark-field image of the sample SAM is observed has been described. In Modification Example 1, a case where a bright-field image of the sample SAM is observed will be described. Therefore, in Modification Example 1, a scattering angle diaphragm ASA2 is used instead of the scattering angle diaphragm ASA1 in the first embodiment. In addition, the scintillator SC2 in Modification Example 1 has the same properties as the scintillator SC1 in the first embodiment.

Figure 3:
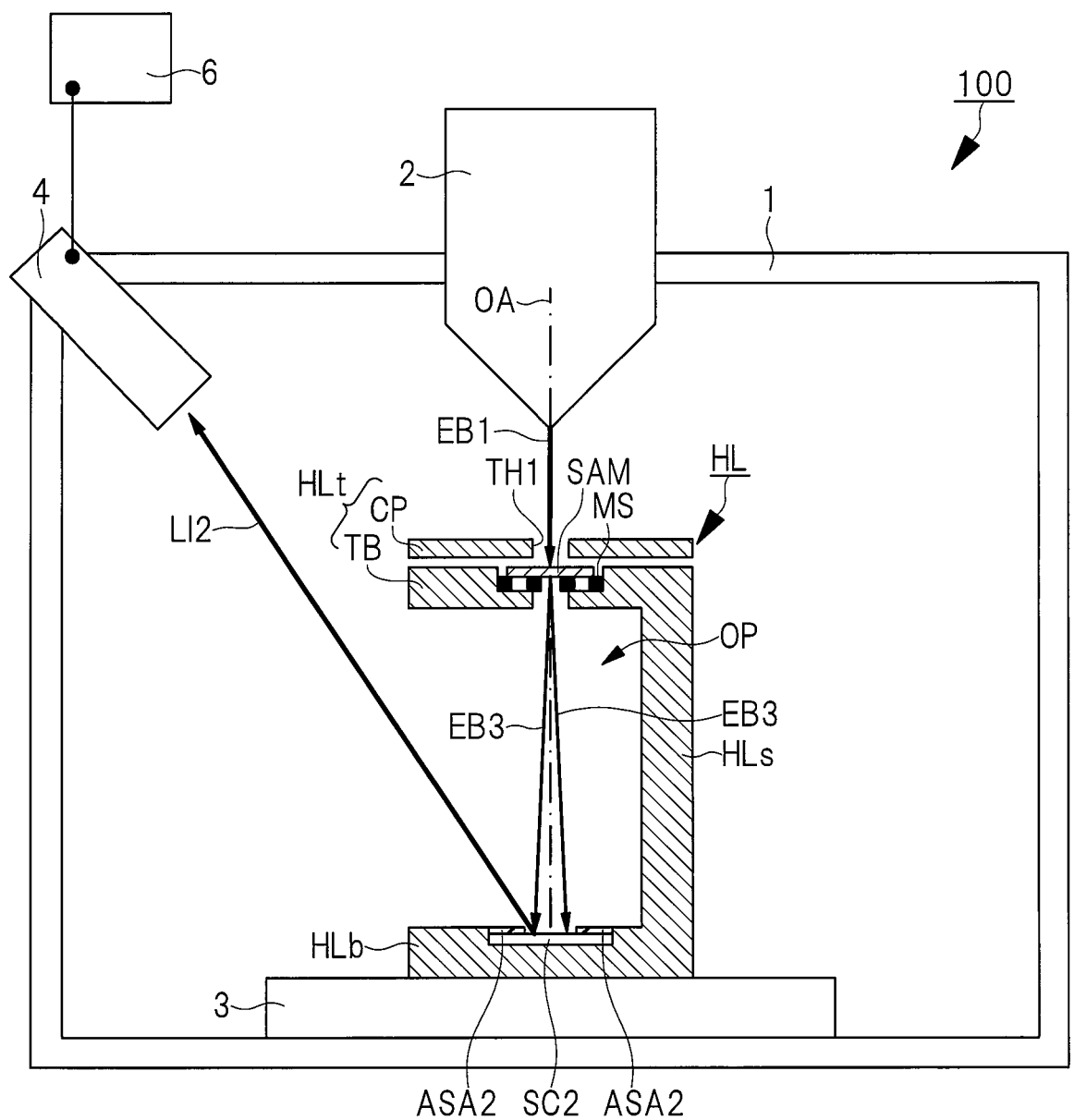
FIG. 3 is a cross-sectional view illustrating a charged particle beam apparatus according to Modification Example 1.

As illustrated in FIG. 3, in Modification Example 1, the charged particle beam EB1 is scattered in the sample SAM or transmits downward through the sample SAM without being scattered. Transmitted charged particles EB3 having transmitted through the sample SAM transmit the scattering angle diaphragm ASA2 and collide with the scintillator SC2 in the opening portion OP of the holder HL.

The transmitted charged particles EB3 in Modification Example 1 transmit through the inside of the opening portion OP at a smaller scattering angle than the transmitted charged particles EB2 in the first embodiment. That is, an angle formed between a direction in which the transmitted charged particles EB3 transmit and the optical axis OA is smaller than an angle formed between a direction in which the transmitted charged particles EB2 transmit and the optical axis OA. Therefore, in the holder HL in Modification Example 1, for the transmitted charged particles EB3 transmitted at a small scattering angle, the scattering angle diaphragm ASA2 is provided instead of the scattering angle diaphragm ASA1. The scattering angle diaphragm ASA2 in Modification Example 1 is set such that only the transmitted charged particles EB3 transmit therethrough.

When the transmitted charged particles EB3 collide with the scintillator SC2, kinetic energy of the transmitted charged particles EB3 is converted into light energy, and light LI2 is emitted from the scintillator SC2. The light LI2 exits from the opening portion OP and is detected by the light detector 4. A transmitted charged particle image (bright-field image) of the sample SAM is obtained by the image processing apparatus 6 based on the detected light LI2.

This way, even in Modification Example 1, substantially the same effect as that of the first embodiment can be obtained except for a difference between the dark-field image and the bright-field image.

Second Embodiment

Hereinafter, an optical member (member) OM1 according to a second embodiment, a holder HL including the optical member OM1, and a charged particle beam apparatus 200 including the holder HL will be described using FIGS. 4 to 6. Hereinafter, a difference between the second embodiment and the first embodiment will be mainly described.

In the second embodiment, the optical member OM1 is attached to the holder HL described in FIG. 1. FIG. 4 is a perspective view illustrating the external appearance of the optical member OM1, FIG. 5 is a perspective view illustrating the holder HL to which the optical member OM1 is attached, and FIG. 6 is a cross-sectional view illustrating the charged particle beam apparatus 200 including the holder HL.

Figure 4:
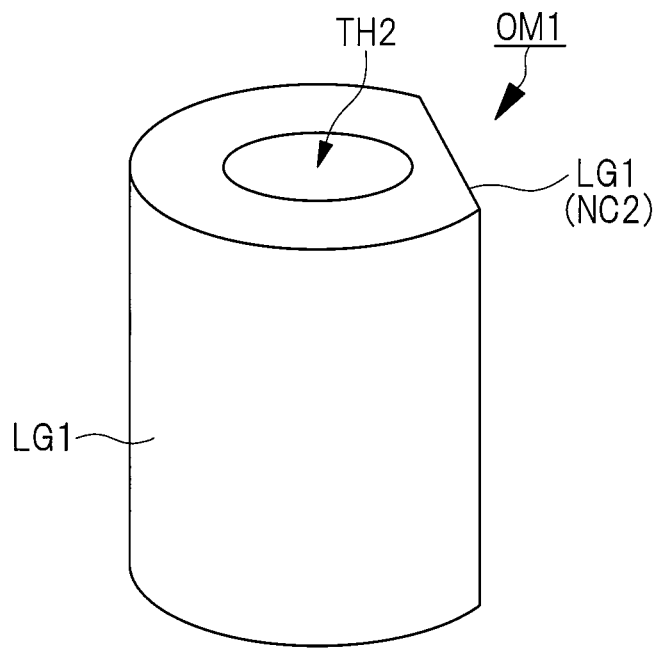
FIG. 4 is a perspective view illustrating an optical member according to a second embodiment.

As illustrated in FIG. 4, the optical member OM1 includes a light guide LG1 in which a hole TH2 is provided. The light guide LG1 has a function of allowing transmission of light and not allowing transmission of an X-ray. A material forming the light guide LG1 is, for example, glass or an acrylic resin.

In addition, a planar shape of the optical member OM1 (the light guide LG1) is a shape that is obtained by providing a notch NC2 in a part of a circular shape or an elliptical shape. In other words, the optical member OM1 is a cylinder that is obtained by providing the notch NC2 in a part of a circular cylinder or an elliptical cylinder.

Figure 5:
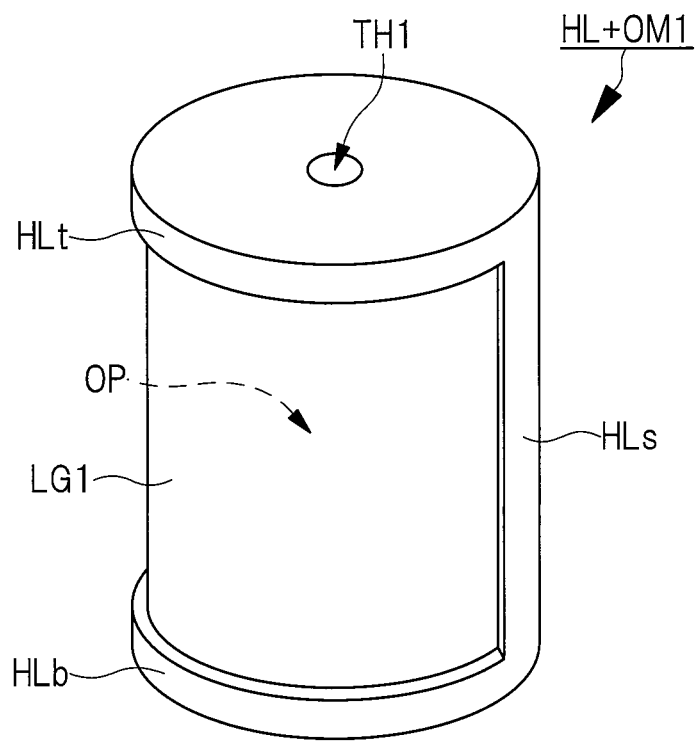
FIG. 5 is a perspective view illustrating the holder including the optical member according to the second embodiment.

As illustrated in FIG. 5, the optical member OM1 is provided in the opening portion OP of the holder HL. At this time, a part of the light guide LG1 is covered with the side member HLs of the holder HL, and the other portion of the light guide LG1 is exposed from the side member HLs. The notch NC2 of the optical member OM1 is the portion covered with the side member HLs and is positioned in the opening portion OP so as to correspond to the notch NC1 of the holder HL. That is, the optical member OM1 is provided in the opening portion OP such that the notch NC2 is in contact with the side member HLs. As a result, when the optical member OM1 is attached to the holder HL, alignment between the optical member OM1 and the holder HL is simple.

In addition, the hole TH2 of the optical member OM1 overlaps with the hole TH1 of the holder HL in a plan view, and the aperture of the hole TH2 is larger than the aperture of the hole TH1.

Figure 6:
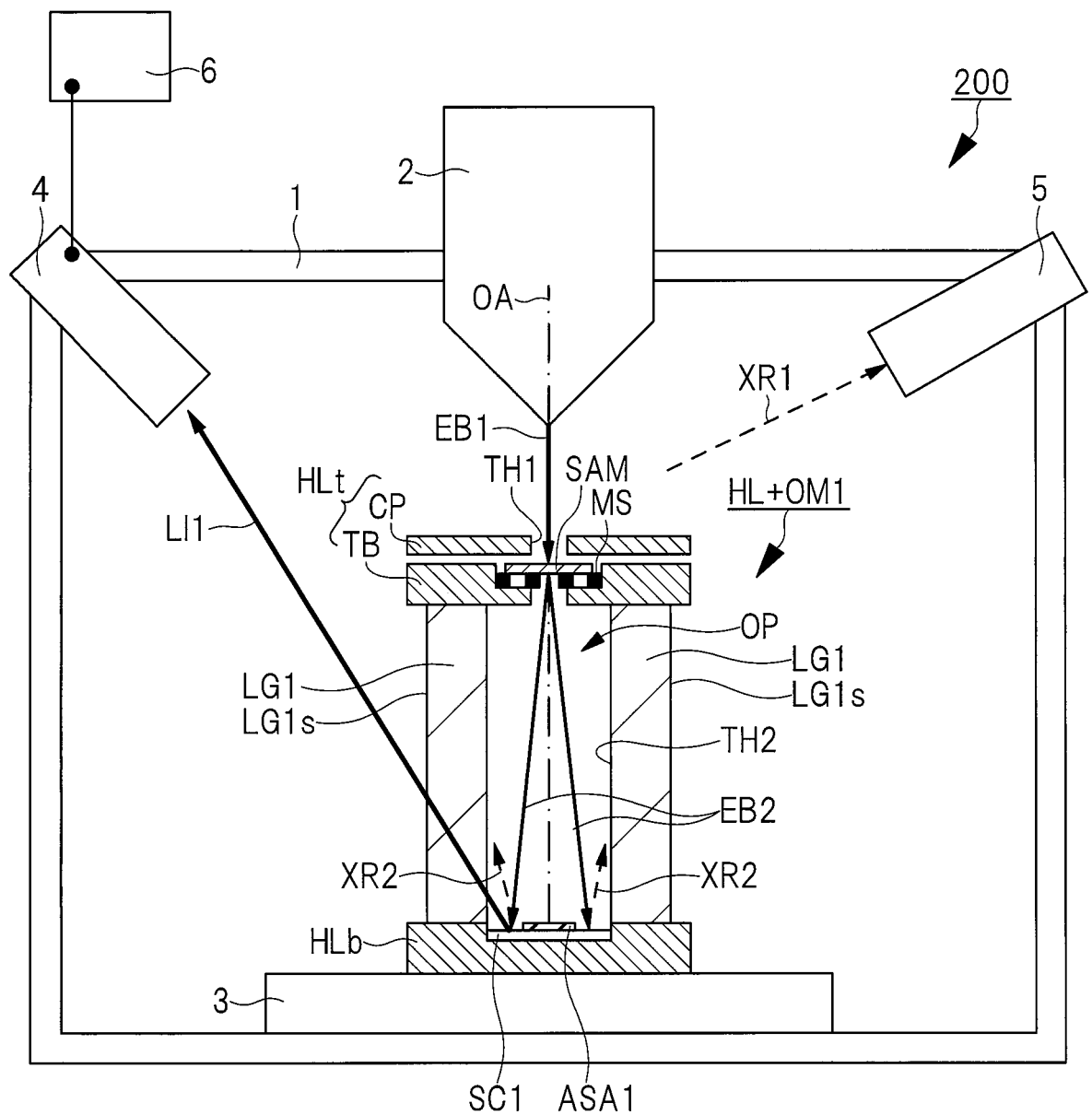
FIG. 6 is a cross-sectional view illustrating a charged particle beam apparatus according to the second embodiment.

As illustrated in FIG. 6, the charged particle beam EB1 emitted from the charged particle optical lens barrel 2 transmits through the hole TH1, is irradiated on the sample SAM, is scattered in the sample SAM, and transmits downward through the sample SAM. The scintillator SC1 is provided between the light guide LG1 and the bottom member HLb such that a part of the scintillator SC1 is exposed in the hole TH2. The transmitted charged particles EB2 transmit through the scattering angle diaphragm ASA1 in the hole TH2 and collide with the scintillator SC1.

The light LI1 emitted from the scintillator SC1 transmits through the inside of the light guide LG1, exits from the opening portion OP such that a side surface LG1s of the light guide LG1 is an exit surface, and is detected by the light detector 4.

Since the light guide LG1 includes the hole TH2, the side surface of the light guide LG1 includes an inner diameter surface moving along the hole TH2 and an outer diameter surface corresponding to an outer wall of the light guide LG1. "The side surface of the light guide LG1" described in the present invention refers to the outer diameter surface of the light guide LG1. Therefore, the reference numeral LG1s is used for both the side surface of the light guide LG1 and the exit surface of the Light LI1.

As described above, the light guide LG1 has a function of allowing transmission of light. Here, the light LI1 emitted from the scintillator SC1 is light from a vacuum-ultraviolet range to a visible range. Accordingly, it can also be said that the light guide LG1 has a function of allowing transmission of the light from a vacuum-ultraviolet range to a visible range.

However, during the observation of the sample SAM, it may be required to detect an X-ray emitted from the sample SAM and to analyze an element included in the sample SAM. Therefore, as illustrated in FIG. 6, the X-ray detector 5 is positioned above the holder HL to be separated from the holder HL and is attached to the upper portion of the chamber 1 of the charged particle beam apparatus 200. The X-ray detector 5 is generally called an EDS (Energy Dispersive X-ray Spectrometry) detector.

When a specific portion of the sample SAM is irradiated with the charged particle beam EB1, a characteristic X-ray having information unique to an element is generated. By detecting the characteristic X-ray using the EDS detector to measure the energy and intensity of the characteristic X-ray, an element forming the specific portion can be qualitatively analyzed. In the present invention, for example, X-rays XR1 to XR3 described below are the above-described characteristic X-rays.

As illustrated in FIG. 6, when the sample SAM is irradiated with the charged particle beam EB1, the X-ray XR1 is emitted from the sample SAM. When the transmitted charged particles EB2 collide with the scintillator SC1, the X-ray XR2 is emitted from the scintillator SC1. In order to analyze the element included in the sample SAM, the X-ray XR1 only needs to be detected. However, when the X-ray detector 5 also detects the X-ray XR2, there is a problem in that appropriate element analysis cannot be performed.

Therefore, as described above, the light guide LG1 in the second embodiment has a function of not allowing transmission of an X-ray. Therefore, the X-ray detector 5 can detect only the X-ray XR1 without detecting the X-ray XR2. When the thickness of the light guide LG1 is extremely small, the X-ray XR2 may transmit through the light guide LG1. Therefore, it is preferable that the light guide LG1 is formed at a sufficient thickness such that the X-ray XR2 cannot transmit through the light guide LG1.

Third Embodiment

Figure 7:
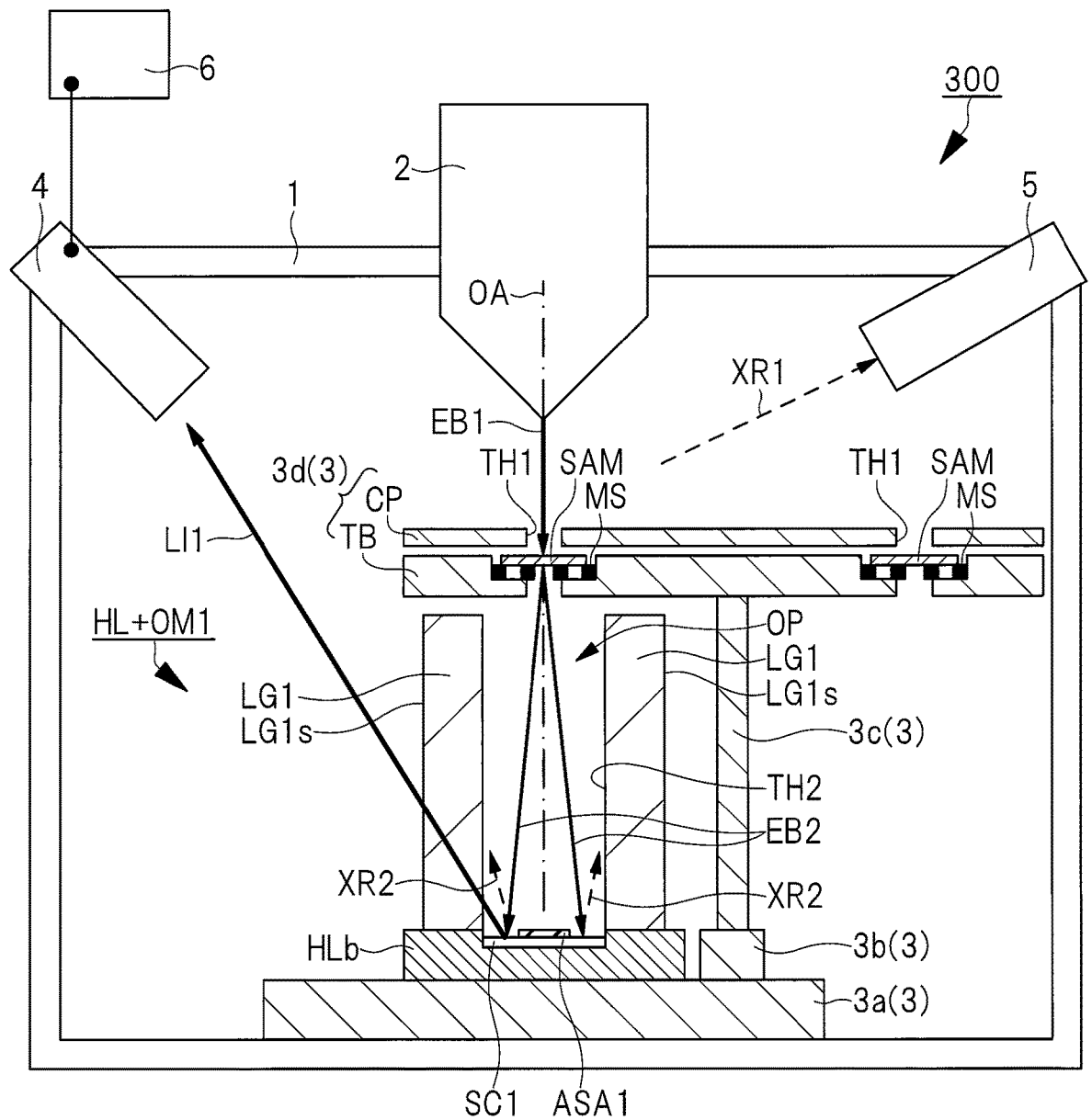
FIG. 7 is a cross-sectional view illustrating a charged particle beam apparatus according to a third embodiment.

Hereinafter, a charged particle beam apparatus 300 including the holder HL according to a third embodiment will be described using FIG. 7. Hereinafter, a difference between the third embodiment and the second embodiment will be mainly described.

In the second embodiment, the mesh MS for providing the sample SAM on the top member HLt of the holder HL is provided. However, in the third embodiment, the top member HLt is not provided on the holder HL, and a rotary table 3d that is a part of the stage 3 is provided instead of the top member HLt. That is, the hole TH1, the mesh MS, and the sample SAM mounted on the mesh MS are provided in the rotary table 3d.

The stage 3 in the third embodiment includes a base portion 3a, a rotation portion 3b, a pillar portion 3c, and the rotary table 3d. The base portion 3a is attached to the lower portion of the chamber and includes a mechanism of adjusting a position in a thickness and a horizontal direction and a mechanism for rotation in a horizontal direction. The rotation portion 3b includes a mechanism for rotating the pillar portion 3c and can rotate the rotary table 3d through the pillar portion 3c. The pillar portion 3c is connected to the rotation portion 3b and the rotary table 3d. In addition, when the sample SAM is replaced, the pillar portion 3c and the rotary table 3d can be easily removed from the stage 3 (the rotation portion 3b).

The rotary table 3d includes the table TB and the cap CP as in the top member HLt in the second embodiment and has a wider surface area than the top member HLt in the second embodiment. In the rotary table 3d, a plurality of holes TH1 are provided, and the mesh MS and the sample SAM can be provided in each of the holes TH1.

In addition, the holder HL in the third embodiment includes the side member HLs and the bottom member HLb without including the top member HLt as described above. Therefore, in the third embodiment, the opening portion OP is a region surrounded by the rotary table 3d that is a part of the stage 3, the side member HLs, and the bottom member HLb. In addition, in the opening portion OP, the optical member OM1 is provided as in the second embodiment, and the scintillator SC1 is provided between the light guide LG1 and the bottom member HLb.

For example, by rotating the rotation portion 3b of the stage 3 after observing one sample SAM, the rotary table 3d can be rotated to observe the following sample SAM. By using the holder HL according to the third embodiment and the charged particle beam apparatus 300, for example, time and effort required to return the internal pressure of the chamber 1 to the atmospheric pressure, to replace the holder HL with another holder HL on which the following sample SAM is mounted, and to adjust the internal pressure of the chamber 1 whenever each of a plurality of the samples SAM is observed can be reduced.

Fourth Embodiment

Hereinafter, an optical member (member) OM2 according to a fourth embodiment, a holder HL including the optical member OM2, and a charged particle beam apparatus 400 including the holder HL will be described using FIGS. 8 to 14. Hereinafter, a difference between the fourth embodiment and the first embodiment or the second embodiment will be mainly described.

Figure 8:
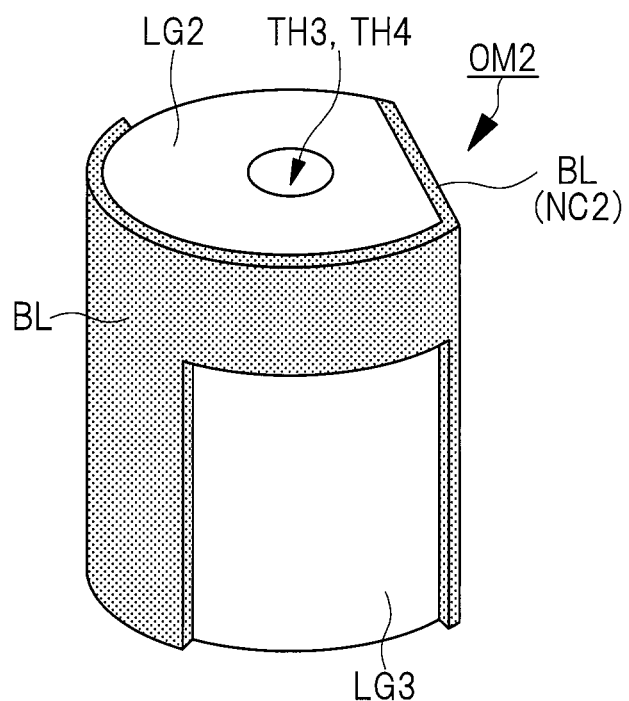
FIG. 8 is a perspective view illustrating an optical member according to a fourth embodiment.
Figure 9:
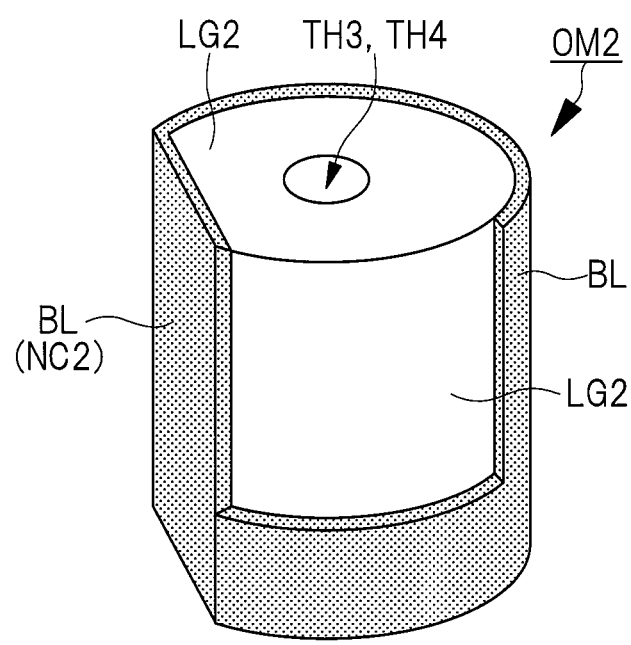
FIG. 9 is a perspective view illustrating an optical member according to the fourth embodiment.
Figure 10:
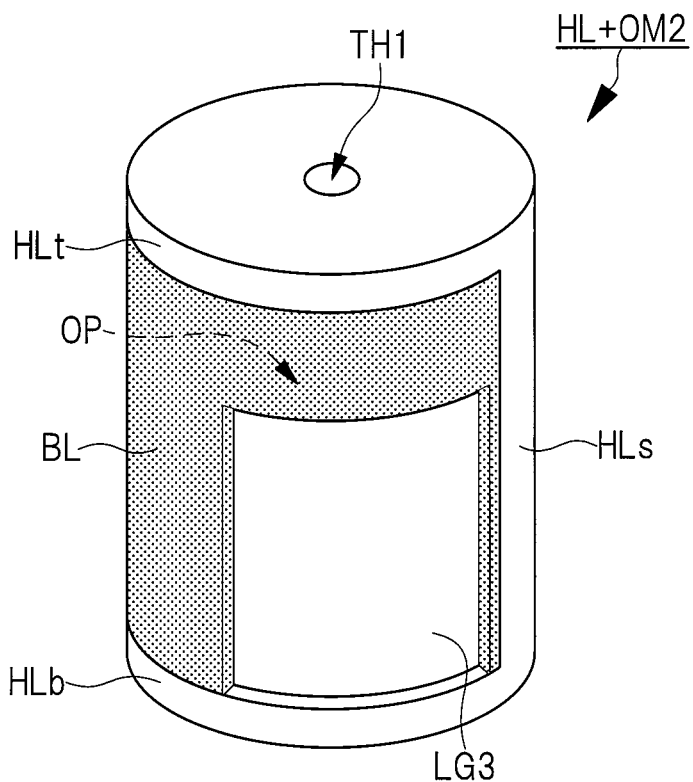
FIG. 10 is a perspective view illustrating the holder including the optical member according to the fourth embodiment.
Figure 11:
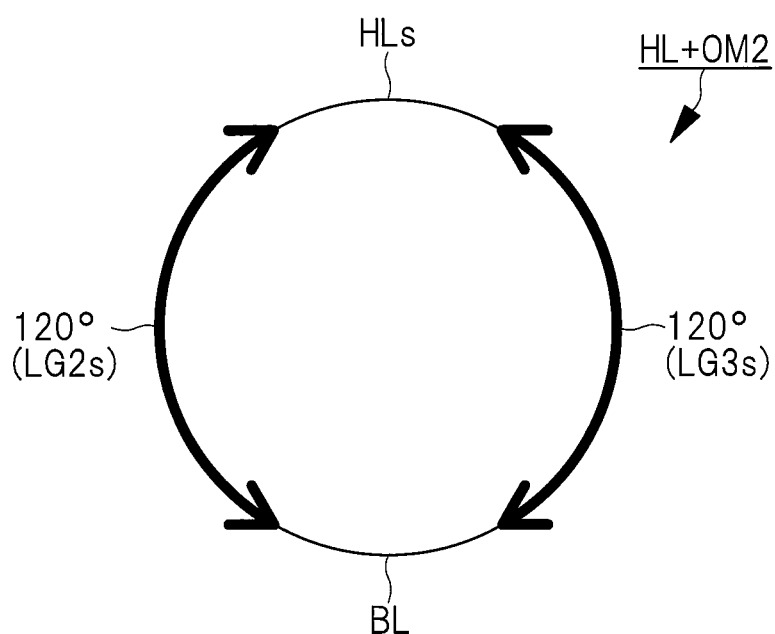
FIG. 11 is a plan view illustrating the holder including the optical member according to the fourth embodiment.
Figure 12:
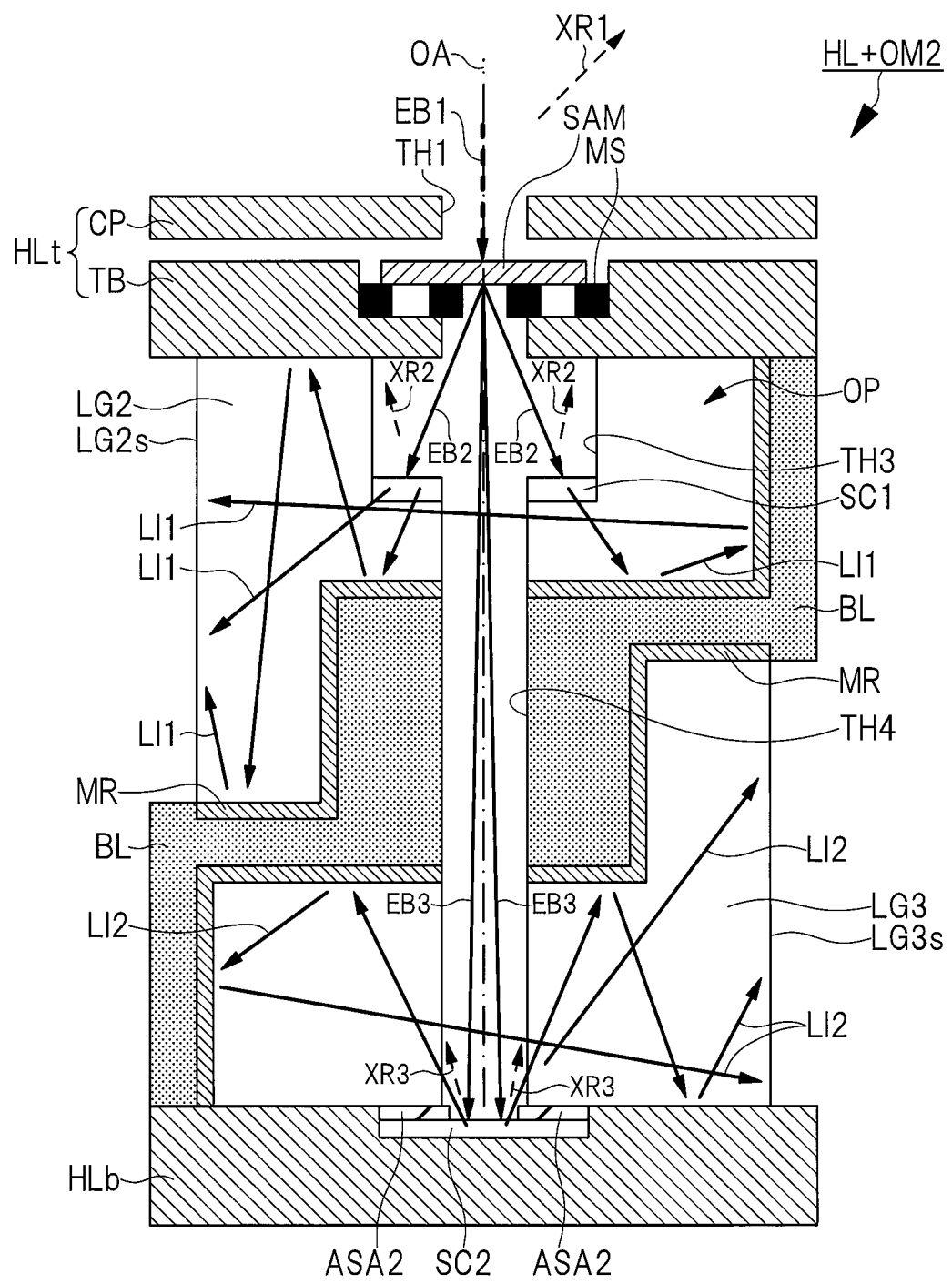
FIG. 12 is a cross-sectional view illustrating the holder including the optical member according to the fourth embodiment.
Figure 13:
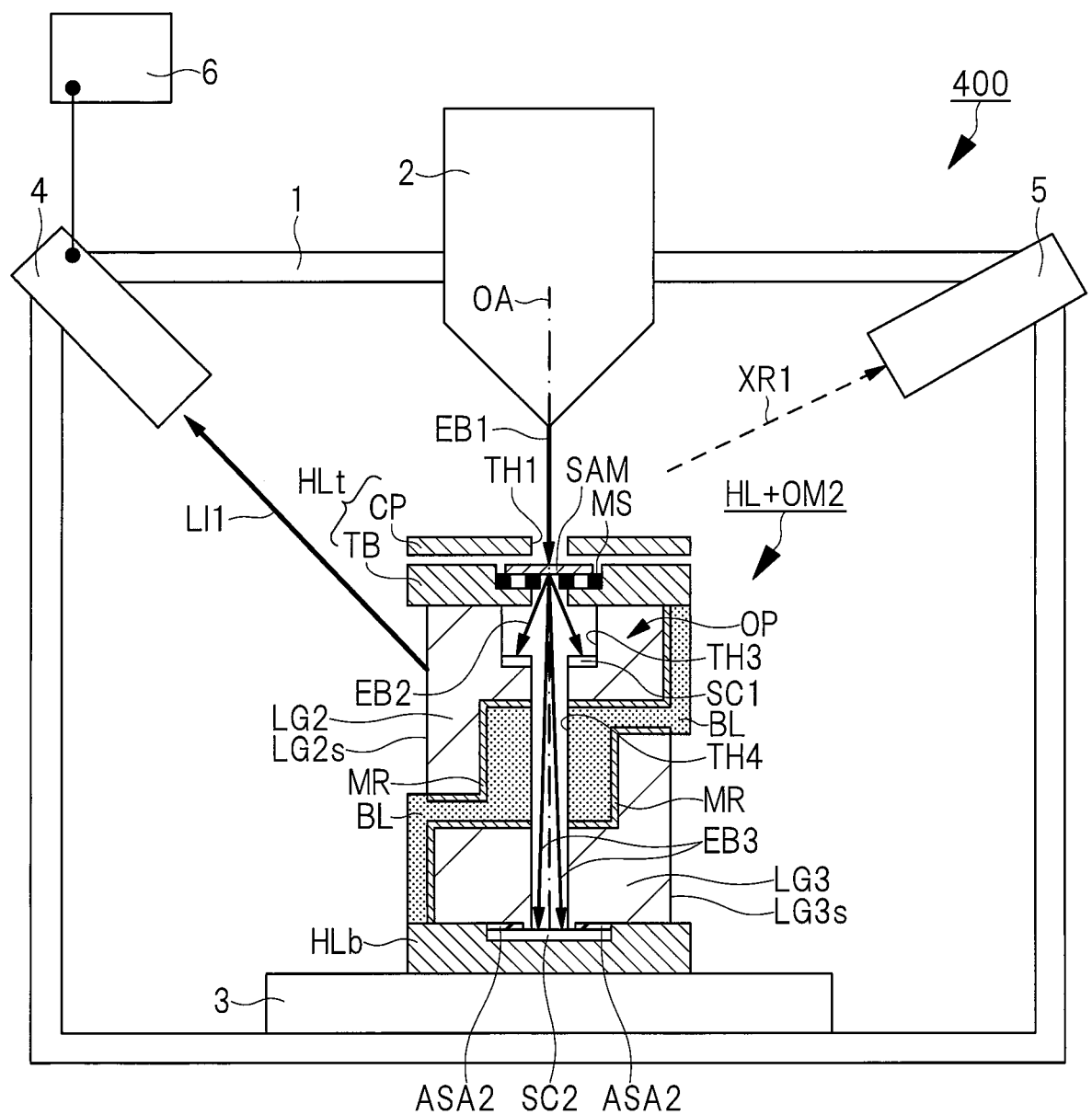
FIG. 13 is a cross-sectional view illustrating a charged particle beam apparatus according to the fourth embodiment.

In the fourth embodiment, the optical member OM2 is attached to the holder HL described in FIG. 1. FIG. 8 is a perspective view illustrating the external appearance of the optical member OM2, FIG. 9 is a perspective view illustrating the external appearance of a side of the optical member OM2 opposite to that of FIG. 8, FIG. 10 is a perspective view illustrating the holder HL to which the optical member OM2 is attached, and FIG. 11 is a plan view illustrating rough positions of an exit surface LG2s of a light guide LG2 and an exit surface LG3s of a light guide LG3. In addition, FIG. 12 is a detailed cross-sectional view illustrating the holder HL including the optical member OM2, and FIG. 13 is a cross-sectional view illustrating the charged particle beam apparatus 400 including the holder HL.

As illustrated in FIGS. 8 and 9, the optical member OM2 includes the light guide LG2 and the light guide LG3 in which a hole 3 and a hole TH4 are provided. The light guide LG2 and the light guide LG3 have a function of allowing transmission of light and not allowing transmission of an X-ray as in the light guide LG1 in the second embodiment. A material forming the light guide LG2 and the light guide LG3 is, for example, glass or an acrylic resin.

In addition, a side surface of each of the light guide LG2 and the light guide LG3 is partially covered with a blocking layer BL. A material forming the blocking layer BL is the same as that of the holder HL and the stage 3 and is a metal such as aluminum or an alloy such as stainless steel. In addition, the material forming the blocking layer BL has a function of not allowing light and an X-ray. In addition, the light is light from a vacuum-ultraviolet range to a visible range.

In addition, as in the optical member OM1 in the second embodiment, a planar shape of the optical member OM2 is a shape that is obtained by providing a notch NC2 in a part of a circular shape or an elliptical shape. In other words, the optical member OM2 is a cylinder that is obtained by providing the notch NC2 in a part of a circular cylinder or an elliptical cylinder.

In the optical member OM2, the blocking layer BL is provided on the side surface of each of the light guide LG2 and the light guide LG3. Therefore, in the planar shape of the optical member OM2, a thin step (unevenness) is formed in a part of an arc of a circular shape or an elliptical shape. Thus, to be exact, the planar shape of each of the light guide LG2 and the light guide LG3 refers to a shape that is obtained by providing the notch NC2 in a part of a circular shape or an elliptical shape. However, here, in the description of the planar shape, the notch NC2 is important. Therefore, in the fourth embodiment, this small difference is recognized as an error, and the planar shape of the optical member OM2 is defined as a shape that is obtained by providing the notch NC2 in a part of a circular shape or an elliptical shape.

As illustrated in FIG. 10, the optical member OM2 is provided in the opening portion OP of the holder HL. At this time, the notch NC2 of the optical member OM2 is the portion covered with the side member HLs and is positioned in the opening portion OP so as to correspond to the notch NC1 of the holder HL. That is, the optical member OM2 is provided in the opening portion OP such that the notch NC2 is in contact with the side member HLs. As a result, when the optical member OM2 is attached to the holder HL, alignment between the optical member OM2 and the holder HL is simple.

In addition, the hole TH3 and the hole TH4 of the optical member OM2 overlap with the hole TH1 of the holder HL in a plan view.

In the fourth embodiment, the portion of the optical member OM2 provided along the notch NC2 is covered with the blocking layer BL. However, as illustrated in FIG. 10, this portion is also covered with the side member HL of the holder HL. Therefore, in the portion, the blocking layer BL is not essential and is not necessarily provided.

As described above, the side surface of each of the light guide LG2 and the light guide LG3 is partially covered with the side member HLs of the holder HL and the blocking layer BL. In other words, in a plan view, the respective side surfaces of the light guide LG2 and the light guide LG3 are divided by the side member HLs and the blocking layer BL. As illustrated in FIG. 11, the side surface (exit surface) LG2s of the light guide LG2 and the side surface (exit surface) LG3s of the light guide LG3 are positioned opposite to each other and are exposed at given aperture angles. The aperture angles of the exit surface LG2s and the exit surface LG3s correspond to central angles with respect to the center of the optical member OM2 (the center of the hole TH3 and the center of the hole TH4). In the fourth embodiment, each of the aperture angles is set to be 60 to 120 degrees in consideration of a range where the light LI2 and light LI3 exit. FIG. 11 illustrates a case where the aperture angle is 120 degrees.

The light guide LG2 or the light guide LG3 has the hole TH3 or the hole TH4. Therefore, as in the light guide LG1 in the second embodiment, "the side surface of the light guide LG2" or "the side surface of the light guide LG3" described in the present invention refers to the outer diameter surface of the light guide LG2 or the light guide LG3. Therefore, as described above, the reference numeral LG2s is used for both the side surface of the light guide LG2 and the exit surface of the Light LI1, and the reference numeral LG3s is used for both the side surface of the light guide LG3 and the exit surface of the Light LI2.

As illustrated in FIGS. 12 and 13, the blocking layer BL is provided between the light guide LG2 and the light guide LG3 such that the light guide LG2 and the light guide LG3 are not in contact with each other. As a result, the light LI2 having transmitted through the inside of the light guide LG2 and the light LI3 having transmitted through the inside of the light guide LG3 can be prevented from interfering each other.

In addition, the hole TH3 is provided in the light guide LG2, and the hole TH4 that communicates with the hole TH3 and has a narrower aperture than the hole TH3 is provided in the light guide LG2, in the blocking layer BL, and in the light guide LG3. The aperture of the hole TH3 is wider than the aperture of each of the hole TH1 and the hole TH4.

The scintillator SC1 is provided on the light guide LG2 positioned in the vicinity of the hole TH4 in the hole TH3 and is in direct contact with the light guide LG2. The scintillator SC2 is provided between the light guide LG3 and the bottom member HLb such that a part of the scintillator SC2 is exposed in the hole TH4, and is in direct contact with the light guide LG3. Therefore, the light LI1 emitted from the scintillator SC1 directly propagates in the light guide LG2, and the light LI2 emitted from the scintillator SC2 directly propagates in the light guide LG3.

In addition, in order to reflect the light LI1 and the light LI2, a reflecting film (mirror film) RF is provided between the light guide LG2 and the blocking layer BL and between the light guide LG3 and the blocking layer BL. A material forming the reflecting film RF is, for example, a metal such as aluminum or an alloy such as brass. In the fourth embodiment, the reflecting film RF is provided such that each of the light LI1 propagating in the light guide LG2 and the light LI2 propagating in the light guide LG3 is attenuated. However, when the object is sufficiently achieved by the blocking layer BL, the reflecting film RF is not essential and is not necessarily provided. For example, by performing mirror-like finishing on the surface of the blocking layer BL, the same function as that of the reflecting film RF can also be imparted to the blocking layer BL.

Figure 14:
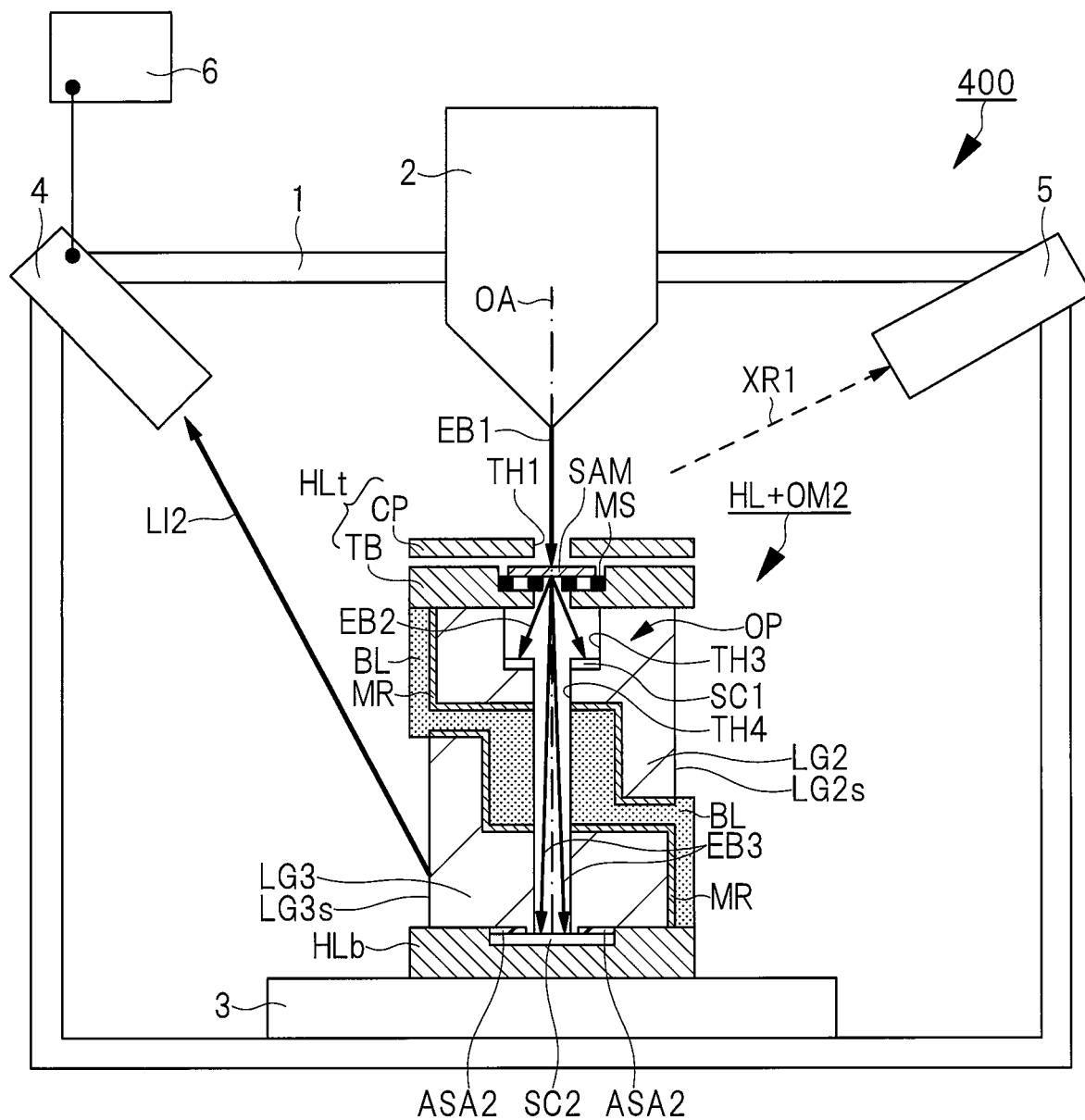
FIG. 14 is a cross-sectional view illustrating the charged particle beam apparatus according to the fourth embodiment.

As illustrated in FIGS. 12, 13, and 14, the charged particle beam EB1 emitted from the charged particle optical lens barrel 2 transmits through the hole TH1, is irradiated on the sample SAM, is scattered in the sample SAM, and transmits downward through the sample SAM. Among the transmitted charged particles having transmitted through the sample SAM, the transmitted charged particles EB2 having transmitted at a relatively large scattering angle collide with the scintillator SC1 in the hole TH3, and the transmitted charged particles EB3 having transmitted at a relatively small scattering angle collide with the scintillator SC2 in the hole TH4. In other words, an angle formed between a direction in which the transmitted charged particles EB3 transmit and the optical axis OA is smaller than an angle formed between a direction in which the transmitted charged particles EB2 transmit and the optical axis OA, the transmitted charged particles EB2 collide with the scintillator SC1 in the hole TH3, and the transmitted charged particles EB3 transmit through the scattering angle diaphragm ASA2 in the hole TH4 and collide with the scintillator SC2.

FIG. 13 illustrates a case where the light LI1 is detected. The light LI1 emitted from the scintillator SC1 transmits through the inside of the light guide LG2, exits from the opening portion OP such that the side surface LG2s of the light guide LG2 is an exit surface, and is detected by the light detector 4.

FIG. 14 illustrates a case where the light LI2 is detected. First, by rotating the stage 3 in the state of FIG. 13, the holder HL is rotated. In this case, as illustrated in FIG. 14, the light LI2 emitted from the scintillator SC2 transmits through the inside of the light guide LG3, exits from the opening portion OP such that the side surface LG3s of the light guide LG3 is an exit surface, and is detected by the light detector 4.

As described above, the light guide LG2 and the light guide LG3 have a function of allowing transmission of light. Here, the light LI1 emitted from the scintillator SC1 and the light LI2 emitted from the scintillator SC2 are light from a vacuum-ultraviolet range to a visible range. Accordingly, it can also be said that the light guide LG2 and the light guide LG3 have a function of allowing transmission of the light from a vacuum-ultraviolet range to a visible range.

However, in the fourth embodiment, as in the second embodiment, during the observation of the sample SAM, it may be required to detect an X-ray emitted from the sample SAM and to analyze an element included in the sample SAM. Therefore, as illustrated in FIGS. 13 and 14, the same X-ray detector 5 as that of the second embodiment is attached to the chamber 1 of the charged particle beam apparatus 400.

Here, when the sample SAM is irradiated with the charged particle beam EB1, the X-ray XR1 is emitted from the sample SAM. When the transmitted charged particles EB2 collide with the scintillator SC1, the X-ray XR2 is emitted from the scintillator SC1. When the transmitted charged particles EB3 collide with the scintillator SC2, the X-ray XR3 is emitted from the scintillator SC2.

The light guide LG2 and the light guide LG3 in the fourth embodiment have a function of not allowing transmission of an X-ray. Therefore, the X-ray detector 5 can detect only the X-ray XR1 without detecting the X-ray XR2 the X-ray XR3. When the thicknesses of the light guide LG2 and the light guide LG3 are extremely small, the X-ray XR2 and the X-ray XR3 may transmit therethrough. Therefore, it is preferable that the light guide LG2 and the light guide LG3 are formed at sufficient thicknesses such that the X-ray XR2 and the X-ray XR3 cannot transmit therethrough.

In addition, each of the blocking layer BL and the holder HL is formed of a metal material or an alloy material and has a function of not allowing transmission of light and an X-ray. Therefore, in the fourth embodiment, the light LI1 and the light LI2 exit from the exit surface LG2s and the exit surface LG3s, respectively, without being mixed with each other. Accordingly, the light LI1 and the light LI2 can be accurately detected by the light detector 4. The X-ray XR2 and the X-ray XR3 can be blocked by the light guide LG2, the light guide LG3, the blocking layer BL, and the holder HL.

In addition, in the fourth embodiment, the light LI1 and the light LI2 can be simultaneously emitted from the transmitted charged particles EB3 and the transmitted charged particles EB4 having different scattering angles. By rotating the stage 3 without extracting the holder HL from the chamber 1, each of the light LI1 and the light LI2 can be detected by the light detector 4.

For example, in the first embodiment or the second embodiment, in order to obtain both a dark-field image and a bright-field image from one sample, it is necessary to replace the holder HL with another holder HL and to replace the scintillator SC1 and the scattering angle diaphragm. ASA1 with the scintillator SC2 and the scattering angle diaphragm. ASA2. On the other hand, in the fourth embodiment, both a dark-field image and a bright-field image can be obtained without replacing the holder HL or the like.

In particular, when a structure as an observation target in the sample SAM is a nanometer-sized structure and it is desired to obtain both a dark-field image and a bright-field image from this structure, it is extremely difficult to specify completely the same subject and to find out completely the same observation point whenever the replacement of the holder HL or the like is performed. By using the holder HL including the optical member OM2 as in the fourth embodiment, the above-described problem can be prevented, and a high-accuracy dark-field image and a high-accuracy bright-field image can be obtained.

Fifth Embodiment

Figure 15:
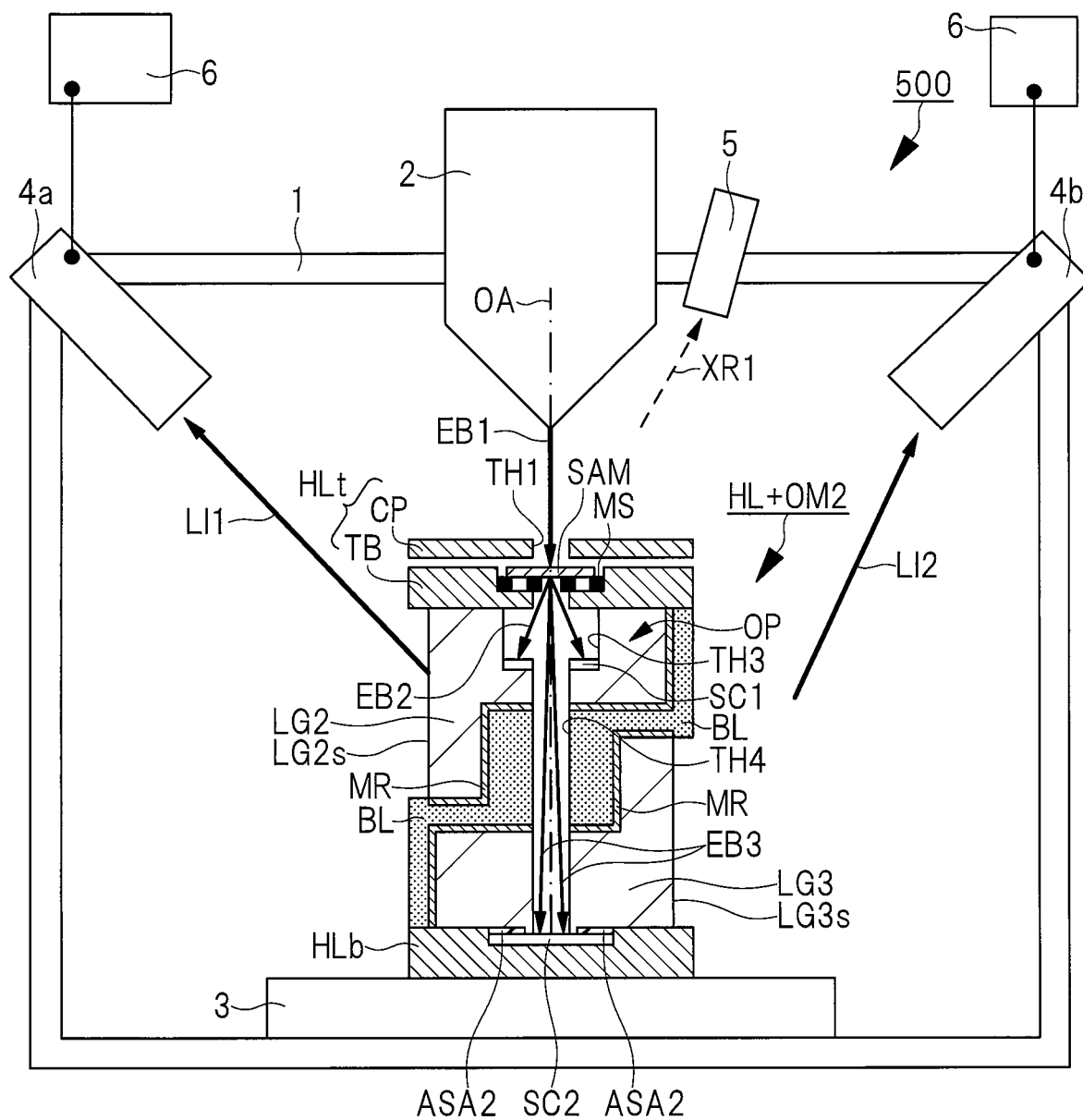
FIG. 15 is a cross-sectional view illustrating a charged particle beam apparatus according to a fifth embodiment.

Hereinafter, a charged particle beam apparatus 500 according to a fifth embodiment will be described using FIG. 15. Hereinafter, a difference between the fifth embodiment and the fourth embodiment will be mainly described.

In the fifth embodiment, as in the fourth embodiment, the optical member OM2 described in FIGS. 8 and 9 is attached to the holder HL described in FIG. 1. However, in the fifth embodiment, unlike the fourth embodiment, as illustrated in FIG. 15, two light detectors including a light detector 4a and a light detector 4b are positioned above the holder HL to be separated from the holder HL and are attached to the upper portion of the chamber 1. The light detector 4a and the light detector 4b have the same function as the light detector 4 in the fourth embodiment and are connected to the same image processing apparatus 6.

The light detector 4a and the light detector 4b face the light guide LG2 and the light guide LG3, respectively, and are positioned opposite to each other with the holder HL interposed therebetween. That is, the light detector 4a is positioned closer to the exit surface LG2s of the light guide LG2 than the light detector 4b, and the light detector 4b is positioned closer to the exit surface LG3s of the light guide LG3 than the light detector 4a.

The light LI1 emitted from the exit surface LG2s is detected by the light detector 4a, and the light LI2 emitted from the exit surface LG3s is detected by the light detector 4b. Therefore, in the fifth embodiment, the light detector 4b is provided, and thus the cost of the charged particle beam apparatus 500 increases as compared to the fourth embodiment. However, the light LI1 and the light LI2 can be detected without rotating the stage 3. Accordingly, a dark-field image and a bright-field image of the sample SAM can be simultaneously obtained.

Sixth Embodiment

Figure 16:
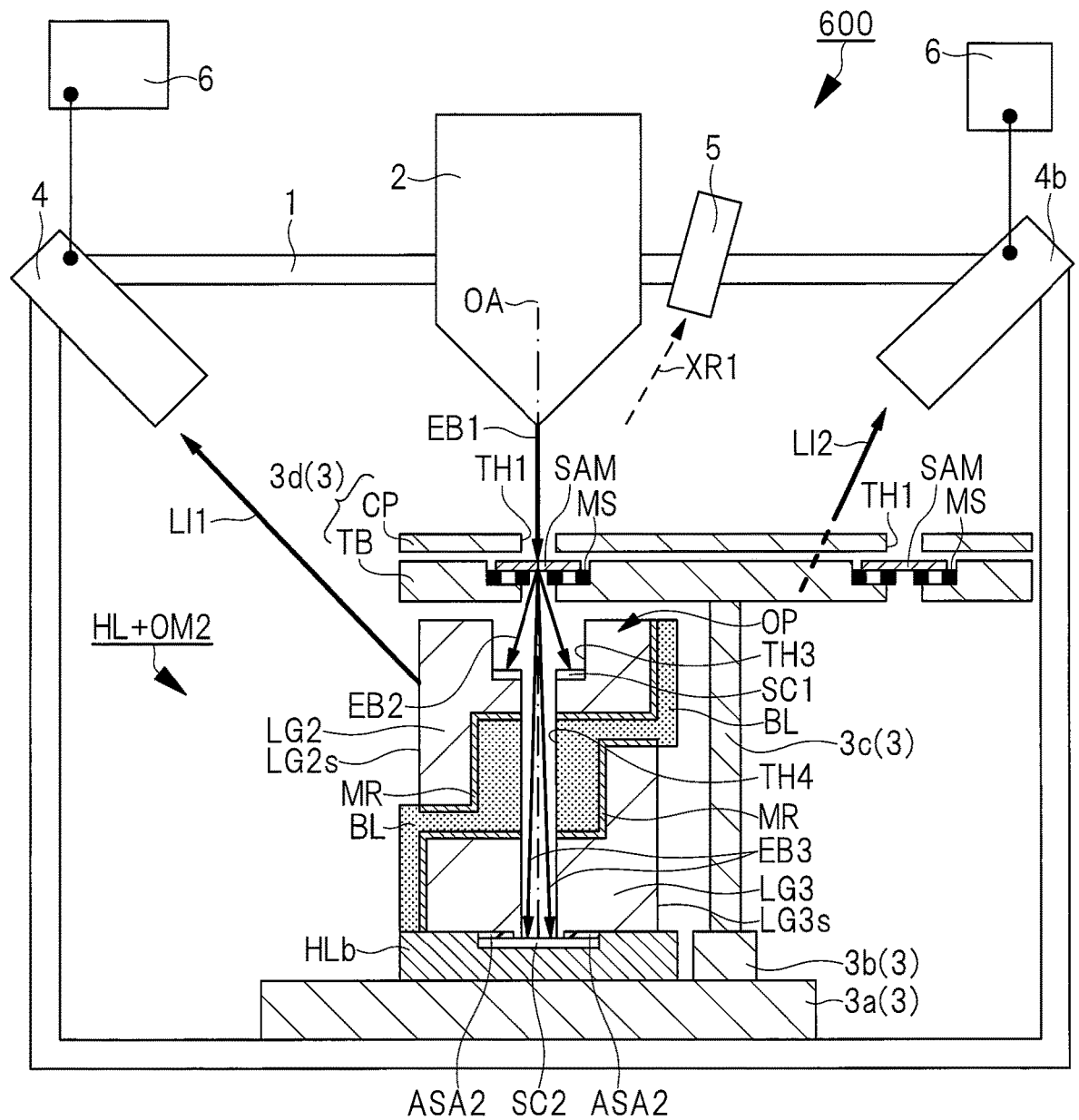
FIG. 16 is a cross-sectional view illustrating a charged particle beam apparatus according to a sixth embodiment.

Hereinafter, a charged particle beam apparatus 600 including the holder HL according to a sixth embodiment will be described using FIG. 16. Hereinafter, a difference between the sixth embodiment and the fifth embodiment will be mainly described. In addition, the technical thought disclosed in the sixth embodiment is very similar to that disclosed in the third embodiment. Therefore, in the following description, the repeated description of the contents described in the third embodiment may be omitted.

In the sixth embodiment, as in the fifth embodiment, the optical member OM2, the light detector 4a, and the light detector 4b are used. However as in the third embodiment, the rotary table 3d that is a part of the stage 3 is provided instead of the top member HLt. That is, the hole TH1, the mesh MS, and the sample SAM mounted on the mesh MS are provided in the rotary table 3d.

As in the third embodiment, the stage 3 in the sixth embodiment includes the base portion 3a, the rotation portion 3b, the pillar portion 3c, and the rotary table 3d. In addition, the holder HL in the sixth embodiment includes the side member HLs and the bottom member HLb without including the top member HLt as described above. Therefore, even in the sixth embodiment, the opening portion OP is a region surrounded by the rotary table 3d that is a part of the stage 3, the side member HLs, and the bottom member HLb. In the opening portion OP, the optical member OM2 is provided as in the fifth embodiment.

In the sixth embodiment, by rotating the rotation portion 3b of the stage 3 after observing one sample SAM, the rotary table 3d can be rotated to observe the following sample SAM. By using the holder HL according to the third embodiment and the charged particle beam apparatus 600, for example, time and effort required to return the internal pressure of the chamber 1 to the atmospheric pressure, to replace the holder HL with another holder HL on which the following sample SAM is mounted, and to adjust the internal pressure of the chamber 1 whenever each of a plurality of the samples SAM is observed can be reduced.

That is, the light LI1 and the light LI2 can be simultaneously detected, and a dark-field image and a bright-field image of the sample SAM can be simultaneously obtained. Further, the next sample SAM can be rapidly observed without replacing the holder HL or the like. In addition, for the next sample SAM, the light LI1 and the light LI2 can be simultaneously detected, and both a dark-field image and a bright-field image of the sample SAM can be obtained.

In the sixth embodiment, the case where two light detectors including the light detector 4a and the light detector 4b are provided has been described based on the fifth embodiment. However, the charged particle beam apparatus 600 according to the sixth embodiment is applicable to the case where the single light detector 4 is provided as in the fourth embodiment. In this case, the light LI1 and the light LI2 cannot be simultaneously detected. However, since the light detector 4b is not provided, the cost of the charged particle beam apparatus 600 can be reduced.

Seventh Embodiment

Hereinafter, an optical member (member) OM3 according to a seventh embodiment and the holder HL including the optical member OM3 will be described using FIGS. 17 to 20. Hereinafter, a difference between the seventh embodiment and the fourth embodiment will be mainly described.

In the seventh embodiment, the optical member OM3 is attached to the holder HL described in FIG. 1. In addition, the charged particle beam apparatus according to the seventh embodiment is the same as the charged particle beam apparatus 400 according to the fourth embodiment, except that the optical member OM3 is used instead of the optical member OM2.

Figure 17:
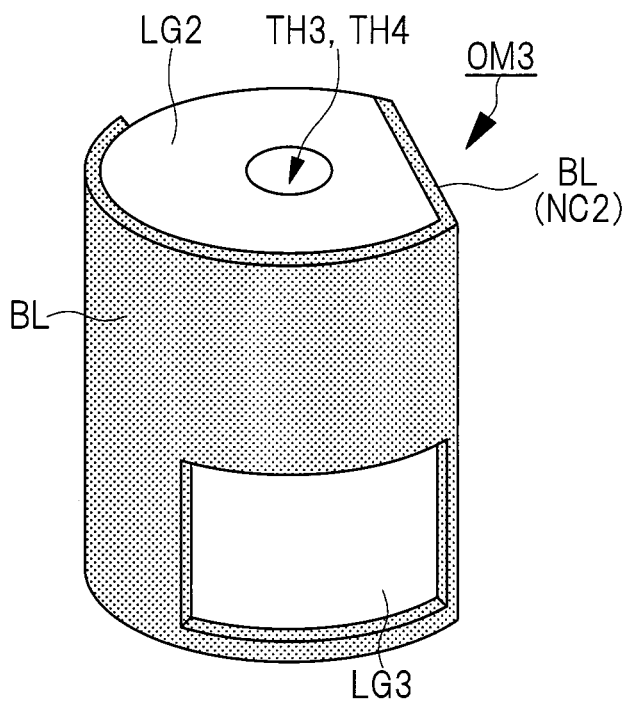
FIG. 17 is a perspective view illustrating an optical member according to a seventh embodiment.
Figure 18:
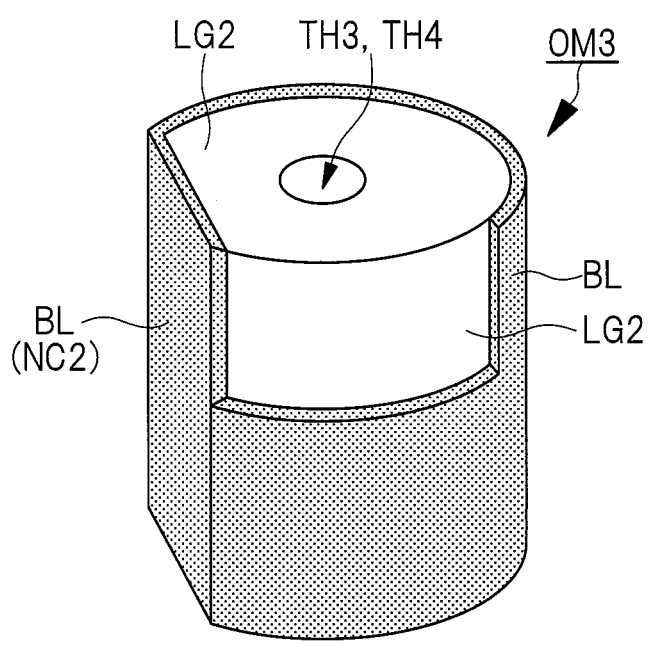
FIG. 18 is a perspective view illustrating the optical member according to the seventh embodiment.
Figure 19:
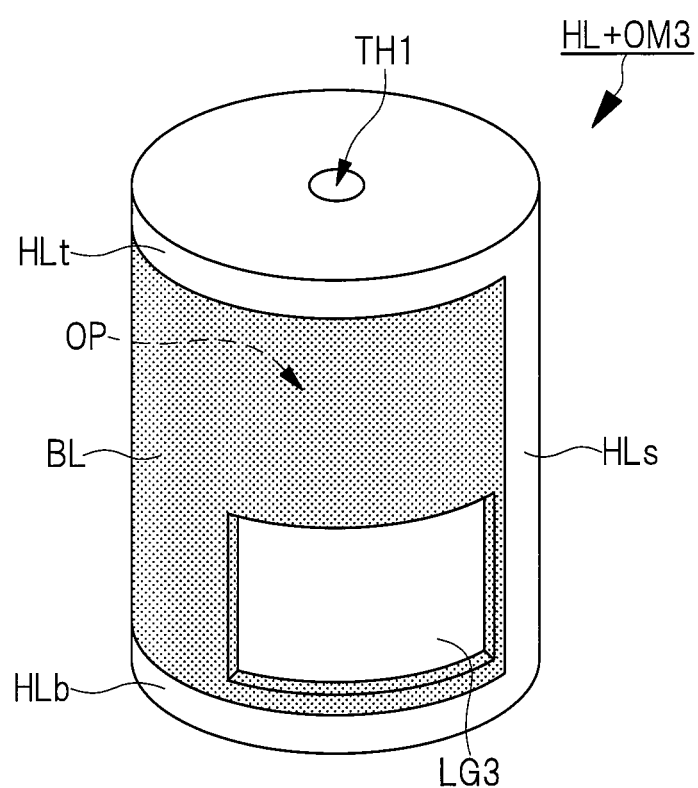
FIG. 19 is a perspective view illustrating the holder including the optical member according to the seventh embodiment.
Figure 20:
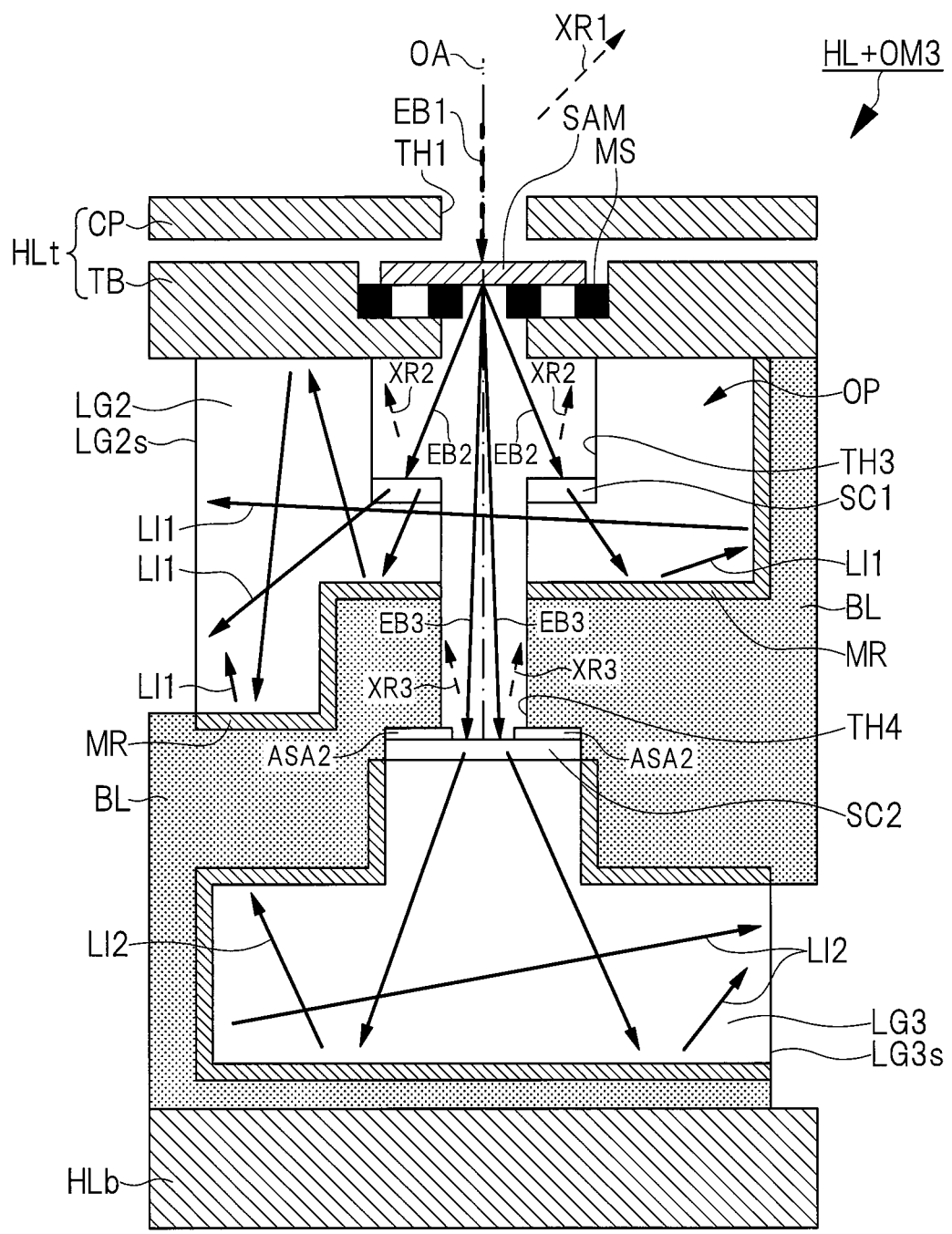
FIG. 20 is a cross-sectional view illustrating the holder including the optical member according to the seventh embodiment.
Figure 21:
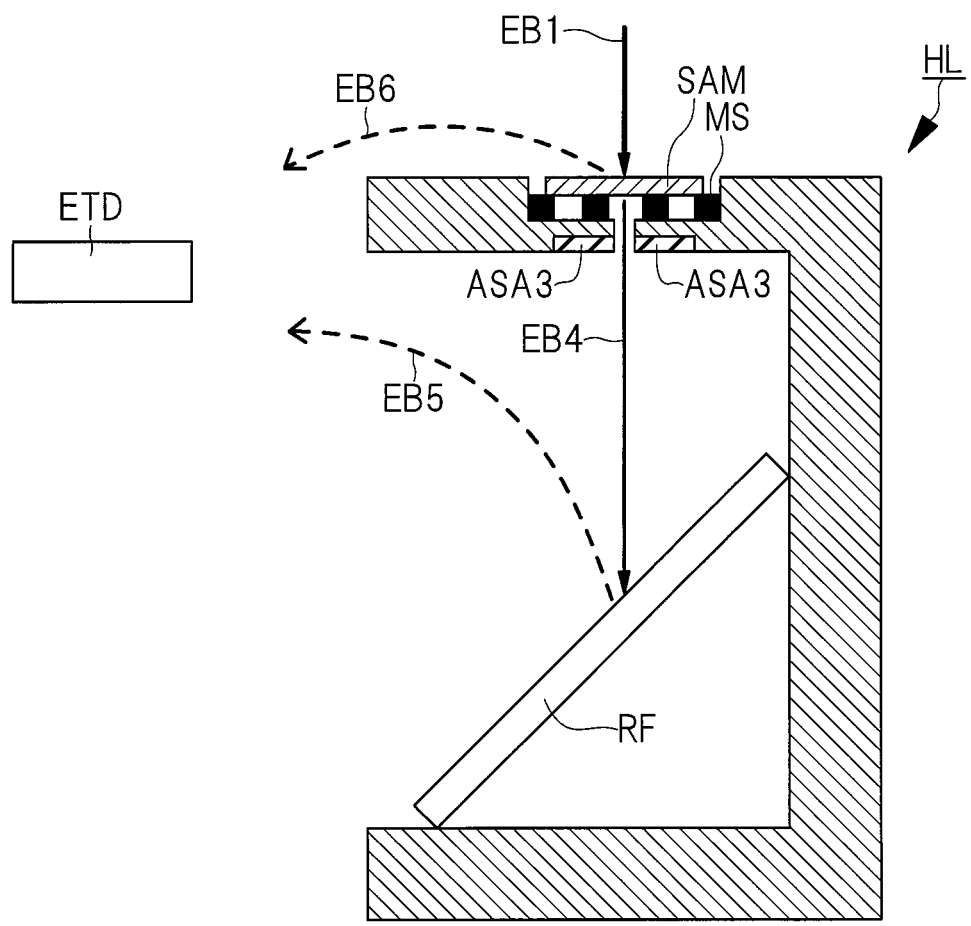
FIG. 21 is a schematic cross-sectional view illustrating a charged particle beam apparatus of the prior art.

FIG. 17 is a perspective view illustrating the external appearance of the optical member OM3, FIG. 18 is a perspective view illustrating the external appearance of a side of the optical member OM3 opposite to that of FIG. 17, FIG. 19 is a perspective view illustrating the holder HL to which the optical member OM3 is attached. In addition, FIG. 20 is a detailed cross-sectional view illustrating the holder HL including the optical member OM3.

As illustrated in FIGS. 17 and 18, the optical member OM3 includes the light guide LG2 and the light guide LG3 as in the optical member OM2 according to the fourth embodiment. However, positions where the blocking layer BL covers the respective side surfaces of the light guide LG2 and the light guide LG3 are different from those of the optical member OM2 according to the fourth embodiment. However, the respective positions of the exit surface LG2s of the light guide LG2 and the exit surface LG3s of the light guide LG3 in a plan view are the same as those of FIG. 11. In addition, as in the optical member OM2 in the fourth embodiment, a planar shape of the optical member OM3 is a shape that is obtained by providing a notch NC2 in apart of a circular shape or an elliptical shape. In other words, the optical member OM3 is a cylinder that is obtained by providing the notch NC2 in a part of a circular cylinder or an elliptical cylinder.

As illustrated in FIG. 19, the optical member OM3 is provided in the opening portion OP of the holder HL. At this time, the optical member OM3 is provided in the opening portion OP such that the notch NC2 is in contact with the side member HLs. As a result, when the optical member OM3 is attached to the holder HL, alignment between the optical member OM3 and the holder HL is simple.

In addition, the hole TH3 and the hole TH4 of the optical member OM2 overlap with the hole TH1 of the holder HL in a plan view.

In the seventh embodiment, the portion of the optical member OM3 provided along the notch NC2 is covered with the blocking layer BL. However, as illustrated in FIG. 19, this portion is also covered with the side member HL of the holder HL. Therefore, in the portion, the blocking layer BL is not essential and is not necessarily provided.

As illustrated in FIG. 20, the blocking layer BL is provided between the light guide LG2 and the light guide LG3 such that the light guide LG2 and the light guide LG3 are not in contact with each other. As a result, the light LI2 having transmitted through the inside of the light guide LG2 and the light LI3 having transmitted through the inside of the light guide LG3 can be prevented from interfering each other.

In addition, the hole TH3 is provided in the light guide LG2, and the hole TH4 that communicates with the hole TH3 and has a narrower aperture than the hole TH3 is provided in the light guide LG2 and in the blocking layer BL. The aperture of the hole TH3 is wider than the aperture of each of the hole TH1 and the hole TH4.

The scintillator SC1 is provided on the light guide LG2 positioned in the vicinity of the hole TH4 in the hole TH3 and is in direct contact with the light guide LG2. The scintillator SC2 is provided on the light guide LG3 such that a part of the scintillator SC2 is exposed in the hole TH4 and the scintillator SC2 is in direct contact with the light guide LG3. Therefore, the light LI1 emitted from the scintillator SC1 directly propagates in the light guide LG2, and the light LI2 emitted from the scintillator SC2 directly propagates in the light guide LG3 in a region below the scintillator SC2. In addition, the scattering angle diaphragm ASA2 is provided between the scintillator SC2 and the blocking layer BL.

The light LI1 emitted from the scintillator SC1 transmits through the inside of the light guide LG2, exits from the opening portion OP such that the side surface LG2s of the light guide LG2 is an exit surface, and is detected by the light detector 4. In addition, the light LI2 emitted from the scintillator SC2 transmits through the inside of the light guide LG3, exits from the opening portion OP such that the side surface LG3s of the light guide LG3 is an exit surface, and is detected by the light detector 4 by rotating the holder HL.

In order to reflect the light LI1 and the light LI2, a reflecting film (mirror film) RF is provided between the light guide LG2 and the blocking layer BL and between the light guide LG3 and the blocking layer BL. However, due to the same reason as described in the fourth embodiment, the reflecting film RF is not necessarily provided.

As described above, the charged particle beam apparatus according to the seventh embodiment is the same as the charged particle beam apparatus 400 according to the fourth embodiment, except that the optical member OM3 is used instead of the optical member OM2. Therefore, since the description of other observation methods and effects are the same as those of the fourth embodiment, the detailed description thereof will not be repeated.

In the seventh embodiment, as in the fifth embodiment, the two light detectors including the light detector 4a and the light detector 4b may be attached to the upper portion of the chamber 1. In this case, the light LI1 and the light LI2 can be detected without rotating the stage 3. Therefore, a dark-field image and a bright-field image of the sample SAM can be simultaneously detected.

In the seventh embodiment, as in the sixth embodiment, the rotary table 3d that is a part of the stage 3 and includes a plurality of meshes MS and a plurality of samples SAM may be provided instead of the top member HLt. In this case, the next sample SAM can be rapidly observed without replacing the holder HL or the like.

The present invention has been described above in detail based on the embodiments, but is not limited to the embodiments, and various modifications may be made without departing from the range of the present invention.

What is claimed is:

1. A holder comprising:
   a top member that has a hole for allowing transmission of a charged particle beam and within which a sample is mountable;
   a bottom member facing the top member;
   a side member that is connected to a part of the top member and a part of the bottom member such that the top member and the bottom member are separated from each other in a cross-sectional view;
   an opening portion that is a region surrounded by the top member, the side member and the bottom member; and
   a scintillator that is provided in the opening portion,
   wherein the top member includes a table member and a cap disposed above the table member,
   wherein the table member includes a recessed portion in a top surface of the table member in which the sample is mountable, and
   wherein a width of the recessed portion in a direction perpendicular to a direction of transmission of the charged particle beam is greater than a width of the hole.

2. The holder according to claim 1,
   wherein the scintillator is provided on the side of the bottom member.

3. The holder according to claim 1,
   wherein the bottom member is to be mounted on a stage of a charged particle beam apparatus.

4. A charged particle beam apparatus comprising:
   a chamber;
   a charged particle optical lens barrel that is attached to an upper portion of the chamber and is capable of emitting a charged particle beam;

a stage that is attached to a lower portion of the chamber;
a holder that is provided on the stage; and
a light detector that is positioned above the holder to be separated from the holder and is attached to the upper portion of the chamber,
wherein the holder includes;
   a top member that has a hole and within which a sample is mountable in the hole,
   a bottom member facing the top member,
   a side member that is connected to a part of the top member and a part of the bottom member such that the top member and the bottom member are separated from each other in a cross-sectional view,
   an opening portion that is a region surrounded by the top member, the side member, and the bottom member, and
   a scintillator that is provided in the opening portion,
   wherein the top member includes a table member and a cap disposed above the table member,
   wherein the table member includes a recessed portion in a top surface of the table member in which the sample is mountable,
   wherein a width of the recessed portion in a direction perpendicular to a direction of transmission of the charged particle beam is greater than a width of the hole,
wherein the light detector is capable of detecting light that is emitted from the scintillator and exits from the opening portion when the sample is mounted on the top member,
wherein the sample in the hole is irradiated with the charged particle beam emitted from the charged particle optical lens barrel, and
wherein transmitted charged particles transmitted through the sample collide with the scintillator.

5. The charged particle beam apparatus according to claim 4, wherein the light detector is an ultra-variable pressure detector.

\* \* \* \* \*